United States Patent
Han et al.

(10) Patent No.: US 9,411,194 B2
(45) Date of Patent: Aug. 9, 2016

(54) DISPLAY DEVICE AND MANUFACTURING METHOD THEREOF

(71) Applicant: Samsung Display Co., Ltd., Yongin, Gyeonggi-Do (KR)

(72) Inventors: Eun Hee Han, Seoul (KR); Hae Ju Yun, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 72 days.

(21) Appl. No.: 14/289,240

(22) Filed: May 28, 2014

(65) Prior Publication Data

US 2015/0212351 A1    Jul. 30, 2015

(30) Foreign Application Priority Data

Jan. 27, 2014 (KR) .......................... 10-2014-0009694

(51) Int. Cl.
  *G02F 1/1334* (2006.01)
  *G02F 1/1337* (2006.01)
  *G02F 1/1333* (2006.01)
  *G02F 1/1343* (2006.01)

(52) U.S. Cl.
  CPC .... *G02F 1/133707* (2013.01); *G02F 1/133377* (2013.01); *G02F 2001/134318* (2013.01); *G02F 2001/134345* (2013.01)

(58) Field of Classification Search
  CPC .................. G02F 1/133707; G02F 1/133377
  USPC .......................... 349/155, 156, 138, 189, 143
  See application file for complete search history.

(56) References Cited

U.S. PATENT DOCUMENTS

| | | | | | |
|---|---|---|---|---|---|
| 5,978,062 | A * | 11/1999 | Liang | ................ | G02F 1/133371 349/132 |
| 7,961,273 | B2 * | 6/2011 | Moriya | ................ | G02B 5/3016 349/155 |
| 2007/0195230 | A1 * | 8/2007 | Kuribayashi | ...... | G02F 1/133514 349/106 |
| 2011/0156995 | A1 * | 6/2011 | Choi | ................ | G02F 1/134363 345/92 |
| 2012/0062448 | A1 * | 3/2012 | Kim | ................ | G02F 1/133377 345/55 |
| 2012/0086881 | A1 * | 4/2012 | Kim | ..................... | H01L 27/1288 349/46 |
| 2012/0281172 | A1 * | 11/2012 | Park | ................ | G02F 1/133707 349/123 |
| 2013/0250220 | A1 * | 9/2013 | Kim | ..................... | G02F 1/1341 349/123 |
| 2013/0265533 | A1 * | 10/2013 | Lim | ................ | G02F 1/133707 349/130 |
| 2013/0293798 | A1 * | 11/2013 | Lee | ................ | G02F 1/133345 349/42 |
| 2013/0308071 | A1 * | 11/2013 | Kim | ..................... | H01L 33/08 349/43 |
| 2013/0335664 | A1 * | 12/2013 | Shim | ..................... | G02F 1/1339 349/43 |
| 2014/0009709 | A1 * | 1/2014 | Lim | ................ | G02F 1/136286 349/43 |
| 2014/0319556 | A1 * | 10/2014 | Kondoh | ............. | H01L 27/3211 257/91 |

FOREIGN PATENT DOCUMENTS

| KR | 1020120026880 A | 3/2012 |
|---|---|---|
| KR | 1020130121545 A | 11/2013 |

\* cited by examiner

*Primary Examiner* — Sang V Nguyen
(74) *Attorney, Agent, or Firm* — Innovation Counsel LLP

(57) ABSTRACT

Provided are a display device and a manufacturing method thereof capable of improving a viewing angle. The display device includes: a substrate; a switching element; a pixel electrode; a common electrode; a roof layer; a liquid crystal layer; and an encapsulation layer. The switching element is on the substrate. The pixel electrode is connected with the switching element. The common electrode is spaced apart from the pixel electrode on the pixel electrode with a plurality of microcavities comprising a microcavity therebetween. The roof layer is on the common electrode. The liquid crystal layer fills the microcavity. The encapsulation layer is on the roof layer to seal the microcavity, in which the common electrode includes a protrusion protruding upwards from a portion contacting an upper surface of the microcavity.

9 Claims, 17 Drawing Sheets

DISPLAY DEVICE AND MANUFACTURING METHOD THEREOF

CROSS-REFERENCE TO RELATED APPLICATION

This application claims priority to and the benefit of Korean Patent Application No. 10-2014-0009694 filed in the Korean Intellectual Property Office on Jan. 27, 2014, the entire contents of which are incorporated herein by reference.

BACKGROUND (a) Technical Field

The present application relates to a display device and a manufacturing method thereof, and more particularly, to a display device and a manufacturing method thereof capable of improving a viewing angle.

(b) Description of the Related Art

The liquid crystal display which is one of the most common types of flat panel displays currently in use, includes two sheets of display panels with field generating electrodes such as a pixel electrode and a common electrode, and a liquid crystal layer interposed therebetween. The liquid crystal display generates an electric field in the liquid crystal layer by applying a voltage to the field generating electrodes to determine alignment of liquid crystal molecules of the liquid crystal layer through the generated electric field and control polarization of incident light, thereby displaying images.

Two sheets of display panels configuring the liquid crystal display may include a thin film transistor array panel and an opposing display panel. In the thin film transistor array panel, a gate line transferring a gate signal and a data line transferring a data signal are formed to cross each other, and a thin film transistor connected with the gate line and the data line, a pixel electrode connected with the thin film transistor, and the like may be formed. In the opposing display panel, a light blocking member, a color filter, a common electrode, and the like may be formed. In some cases, the light blocking member, the color filter, and the common electrode may be formed on the thin film transistor array panel.

However, in a liquid crystal display in the related art, two sheets of substrates are necessarily used, and respective constituent elements are formed on the two sheets of substrates, and as a result, there are problems in that the display device is heavy and thick, has high cost, and has a long processing time.

The above information disclosed in this Background section is only for enhancement of understanding of the background and therefore it may contain information that does not form the prior art that is already known in this country to a person of ordinary skill in the art.

SUMMARY

Embodiments have been made in an effort to provide a display device and a manufacturing method thereof having features of reducing a weight, a thickness, cost, and a processing time by manufacturing the display device by using one substrate.

Further, embodiments have been made in an effort to provide a display device and a manufacturing method thereof having features of improving a viewing angle.

An exemplary embodiment provides a display device, including: a substrate; a switching element; a pixel electrode; a common electrode; a roof layer; a liquid crystal layer; and an encapsulation layer. The switching element is on the substrate. The pixel electrode is connected with the switching element. The common electrode is spaced apart from the pixel electrode on the pixel electrode with a plurality of microcavities comprising a microcavity therebetween. The roof layer is on the common electrode. The liquid crystal layer fills the microcavity. The encapsulation layer is on the roof layer to seal the microcavity. The common electrode includes a protrusion protruding upwards from a portion contacting an upper surface of the microcavity.

A height of the microcavity positioned below the protrusion may be larger than a height of a microcavity at a portion where the protrusion is not formed.

A cross-sectional shape of the protrusion may have at least one of a triangle, a semicircle, a quadrangle, a trapezoid, and a semioval.

A cross-sectional shape of the protrusion may have a shape where an upper side of the trapezoid is modified to be a curved line.

A planar shape of the protrusion may have a cross shape.

The protrusion may include a horizontal protrusion, a vertical protrusion, and a central protrusion at a cross point of the horizontal protrusion and the vertical protrusion.

The pixel electrode may include a horizontal stem, a vertical stem, a central pattern at a cross point of the horizontal stem and the vertical stem, and a minute branch extending from the horizontal stem, the vertical stem, and the central pattern.

The horizontal stem, the vertical stem, and the central pattern may overlap with the protrusion of the common electrode.

The pixel electrode may have a planar shape, and the pixel electrode may include a cutout which is adjacent to at least a part of the edge of the pixel electrode to be disposed along the edge.

The display device may further include a gate line and a data line on the substrate; and a storage electrode line on the substrate and configured to have a predetermined voltage applied. The switching element may include a first switching element and a second switching element connected to the gate line and the data line, and a third switching element connected to the gate line, the second switching element, and the storage electrode line. The pixel electrode may include a first subpixel electrode and a second subpixel electrode, the first subpixel electrode may be connected to the first switching element, and the second subpixel electrode may be connected to the second switching element.

Another exemplary embodiment provides a manufacturing method of a display device as follows. A switching element is formed on a substrate. A pixel electrode connected with the switching element is formed. A sacrificial layer including a protrusion is formed on the pixel electrode. A common electrode is formed on the sacrificial layer. A roof layer is formed on the common electrode. The common electrode and the roof layer are patterned so that a part of the sacrificial layer is exposed. A microcavity is formed between the pixel electrode and the common electrode by removing the sacrificial layer. A liquid crystal layer is formed by injecting a liquid crystal material into the microcavity. An encapsulation layer is formed to seal the microcavity.

The protrusion may protrude upwards from an upper surface of the sacrificial layer.

A cross-sectional shape of the protrusion may have at least one of a triangle, a semicircle, a quadrangle, a trapezoid, and a semioval.

A planar shape of the protrusion may have a cross shape.

The common electrode may include a protrusion positioned on the protrusion of the sacrificial layer.

A height of the microcavity positioned below the protrusion of the common electrode may be larger than a height of a microcavity of a portion where the protrusion of the common electrode is not formed.

A cross-sectional shape of the protrusion of the common electrode may have at least one of a triangle, a semicircle, a quadrangle, a trapezoid, and a semioval.

A cross-sectional shape of the protrusion of the common electrode may have a shape where an upper side of the trapezoid is modified to be a curved line.

A planar shape of the protrusion of the common electrode may have a cross shape.

The protrusion of the common electrode may include a horizontal protrusion, a vertical protrusion, and a central protrusion formed at a cross point of the horizontal protrusion and the vertical protrusion.

As described above, the display device and the manufacturing method thereof according to the exemplary embodiments have the following effects.

In the display device and the manufacturing method thereof according to the exemplary embodiments, it is possible to reduce a weight, a thickness, cost, and a processing time by manufacturing the display device by using one substrate.

Further, it is possible to improve a viewing angle by forming a protrusion on a common electrode to drive one pixel into a plurality of domains.

DETAILED DESCRIPTION OF THE EMBODIMENTS

Figure 1:
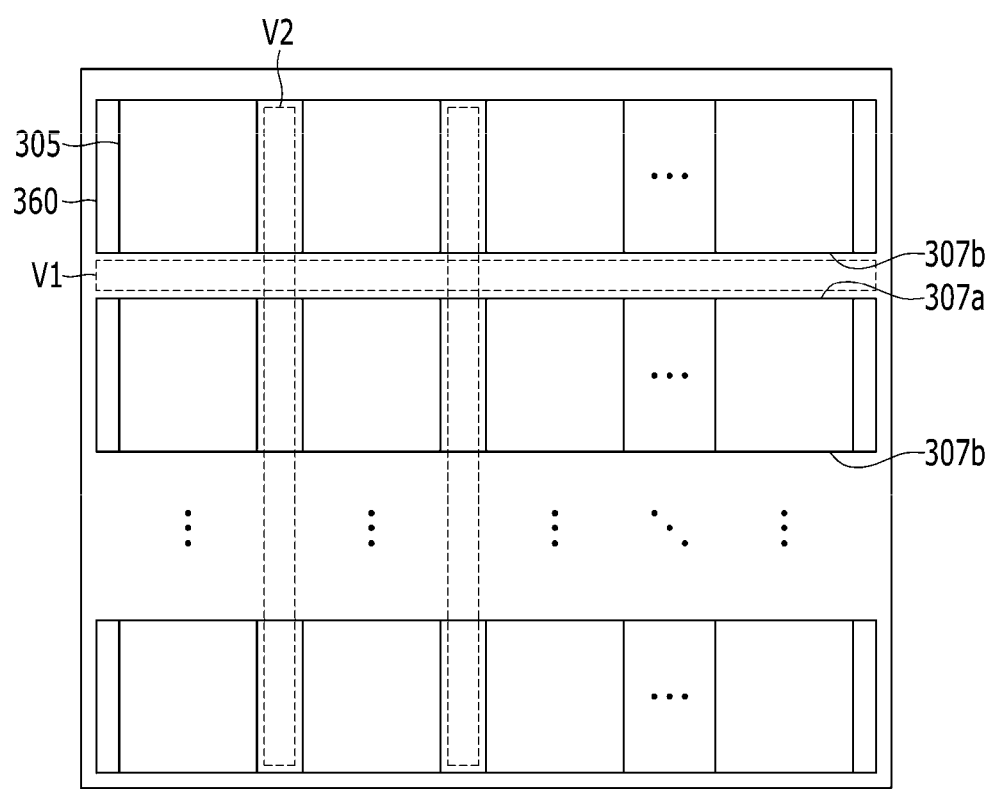
FIG. 1 is a plan view illustrating a display device according to an exemplary embodiment.

The inventive concept will be described more fully hereinafter with reference to the accompanying drawings, in which exemplary embodiments of the invention are shown. As those skilled in the art would realize, the described embodiments may be modified in various different ways, all without departing from the spirit or scope of the inventive concept.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, a display device according to an exemplary embodiment will be schematically described below with reference to FIG. 1.

FIG. 1 is a plan view illustrating a display device according to an exemplary embodiment.

A display device according to the exemplary embodiment includes a substrate 110 made of a material such as glass or plastic.

A microcavity 305 covered by a roof layer 360 is formed on the substrate 110. The roof layers 360 extend in a row direction, and a plurality of microcavities 305 is formed below one roof layer 360.

The microcavities 305 may be disposed in a matrix form, first valleys V1 are positioned between the microcavities 305 adjacent to each other in a column direction, and second valleys V2 are positioned between the microcavities 305 adjacent to each other in a row direction.

The plurality of roof layers 360 are separated from each other with the first valley V1 therebetween. The microcavity 305 is not covered by the roof layer 360, but may be exposed to the outside at a portion contacting the first valley V1. This is called injection holes 307a and 307b.

The injection holes 307a and 307b are formed at both edges of the microcavity 305. The injection holes 307a and 307b are configured by a first injection hole 307a and a second injection hole 307b. The first injection hole 307a is formed to extend to and expose a side of a first edge of the microcavity 305, and the second injection hole 307b is formed to extend to and expose a side of a second edge of the microcavity 305. The side of the first edge and the side of the second edge of the microcavity 305 face each other.

Each roof layer 360 is formed to be separated from the substrate 110 between the adjacent second valleys V2 to form the microcavity 305. That is, the roof layer 360 is formed to cover the rest of the sides except for the sides of the first edge and the second edge in which the injection holes 307a and 307b are formed.

A structure of the display device according to the exemplary embodiment described above is just exemplified and may be variously modified. For example, a layout form of the microcavities 305, the first valleys V1, and the second valleys V2 may be modified, and the plurality of roof layers 360 may be connected to each other at the first valleys V1, and a part of each roof layer 360 is separated from the substrate 110 at the second valley V2 and thus the adjacent microcavities 305 may be connected to each other.

Hereinafter, one pixel of the display device according to the exemplary embodiment will be schematically described below with reference to FIG. 2.

Figure 2:
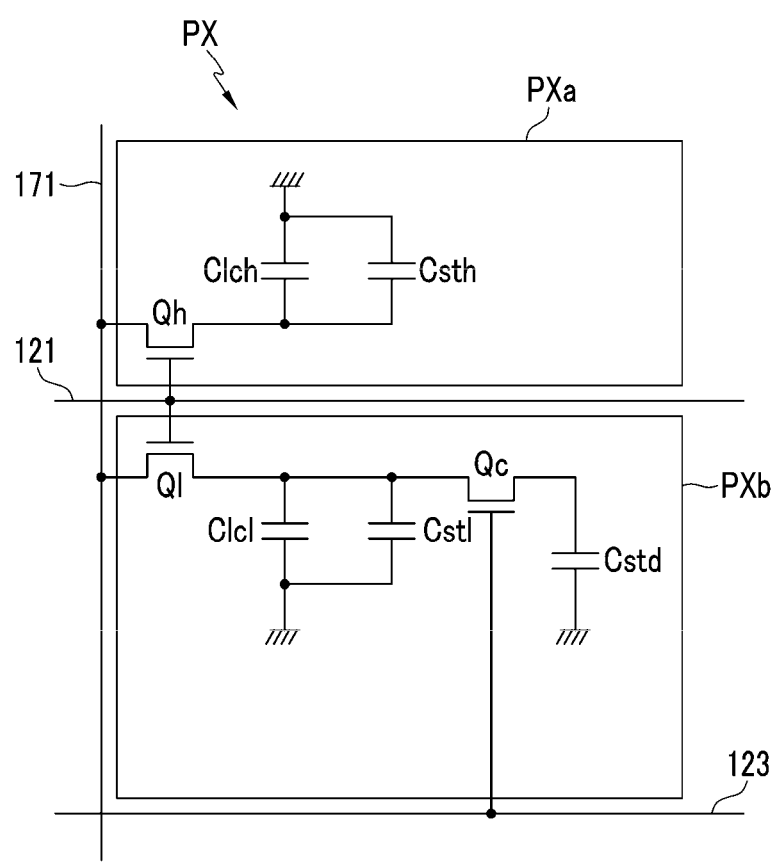
FIG. 2 is an equivalent circuit diagram of one pixel of the display device according to the exemplary embodiment.

FIG. 2 is an equivalent circuit diagram of one pixel of the display device according to the exemplary embodiment.

The display device according to the exemplary embodiment may include signal lines including a gate line 121, a step-down gate line 123, and a data line 171, and a pixel PX connected thereto.

Each pixel PX includes first and second subpixels PXa and PXb. The first subpixel PXa includes a first switching element Qh, a first liquid crystal capacitor Clch, and a first storage capacitor Csth. The second subpixel PXb includes second and third switching elements Ql and Qc, a second liquid crystal capacitor Clcl, a second storage capacitor Cstl, and a step-down capacitor Cstd.

The first and second switching elements Qh and Ql are connected to the gate line 121 and the data line 171, respectively, and the third switching element Qc is connected to the step-down gate line 123.

The first and second switching elements Qh and Ql are three-terminal elements such as a thin film transistor, and control terminals thereof are connected to the gate line 121, input terminals are connected to the data line 171, and output terminals are connected to the first and second liquid crystal capacitors Clch and Clcl and the first and second storage capacitors Csth and Cstl, respectively.

The third switching element Qc is also a three-terminal element such as a thin film transistor, and a control terminal thereof is connected to the step-down gate line 123, an input terminal is connected to the second liquid crystal capacitor Clcl, and an output terminal is connected to the step-down capacitor Cstd.

The step-down capacitor Cstd is connected to the output terminal of the third switching element Qc and a common voltage.

When describing an operation of the pixel PX, first, when a gate-on voltage Von is applied to the gate line 121, the first and second switching elements Qh and Ql connected to the gate line 121 are turned on. Accordingly, the data voltage of the data line 171 is applied to the first and second liquid crystal capacitors Clch and Clcl through the turned-on first and second switching elements Qh and Ql. As a result, the first and second liquid crystal capacitors Clch and Clcl are charged by a difference between the data voltage Vd and a common voltage Vcom. In this case, a gate-off voltage Voff is applied to the step-down gate line 123.

Next, when the gate-off voltage Voff is applied to the gate line 121 and the gate-on voltage Von is applied to the step-down gate line 123 at the same time, the first and second switching elements Qh and Ql connected to the gate line 121 are turned off, and the third switching element Qc is turned on. Then, a charging voltage of the second liquid crystal capacitor Clcl is decreased, and the step-down capacitor Cstd is charged. Since the charging voltage of the second liquid crystal capacitor Clcl is decreased by a capacitance of the step-down capacitor Cstd, the charging voltage of the second liquid crystal capacitor Clcl is lower than the charging voltage of the first liquid crystal capacitor Clch.

In this case, the charging voltages of the two liquid crystal capacitors Clch and Clcl represent different gamma curves, and a gamma curve of one pixel voltage becomes a curve acquired by combining the different gamma curves. A combined gamma curve at the front coincides with a reference gamma curve at the front which is most appropriately predetermined, and a combined gamma curve at the side becomes closest to the reference gamma curve at the front. As such, the charging voltages of the first and second liquid crystal capacitors Clch and Clcl are different from each other, thereby improving side visibility of the display device.

Next, a display device according to an exemplary embodiment will be described in more detail with reference to FIGS. 3 to 5.

Figure 3:
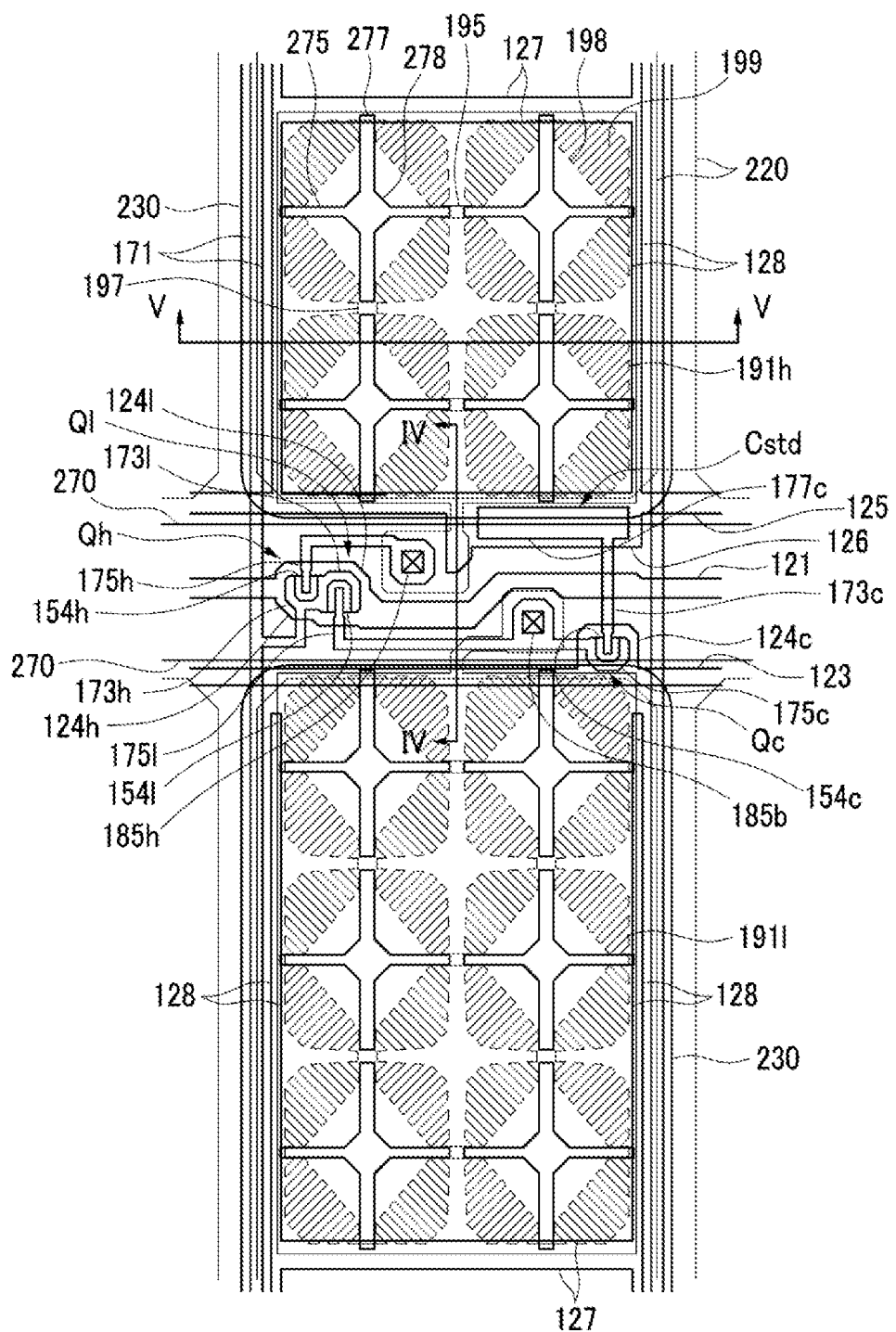
FIG. 3 is a plan view illustrating one pixel of a display device according to an exemplary embodiment.
Figure 4:
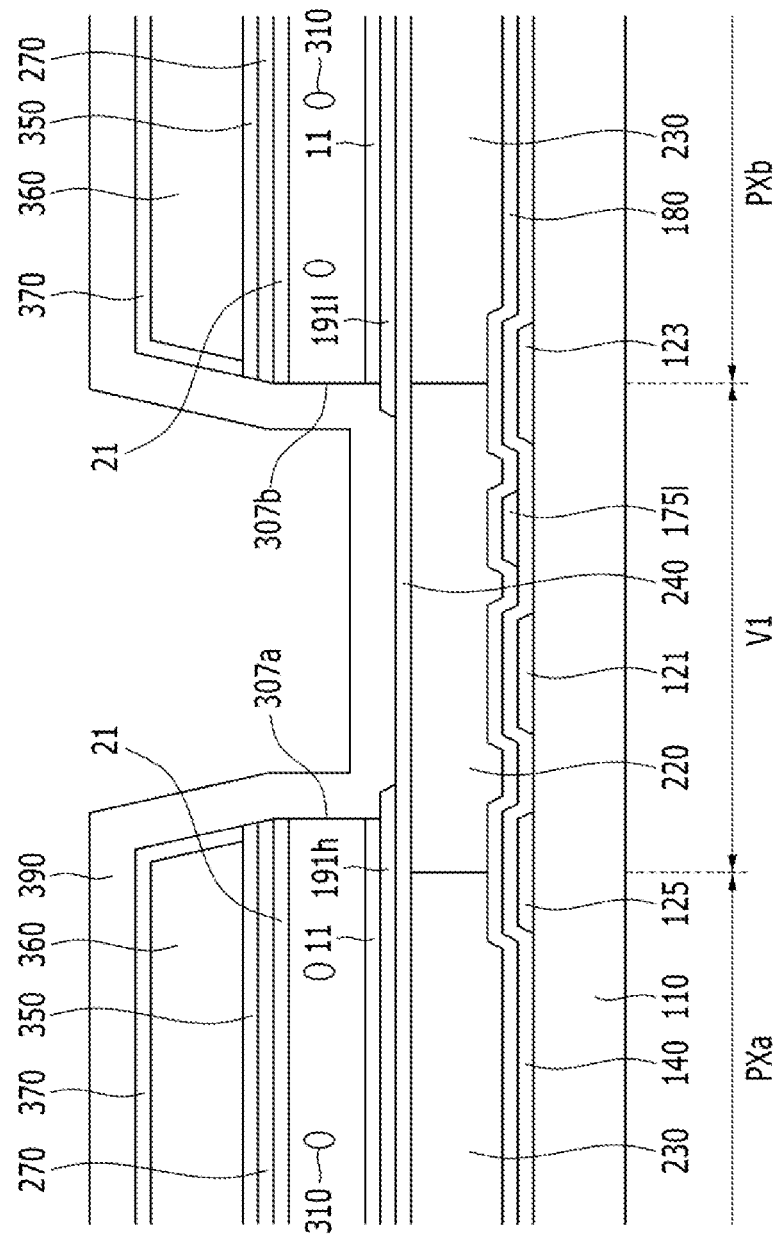
FIG. 4 is a cross-sectional view illustrating the display device of FIG. 3 taken along line IV-IV according to the exemplary embodiment.
Figure 5:
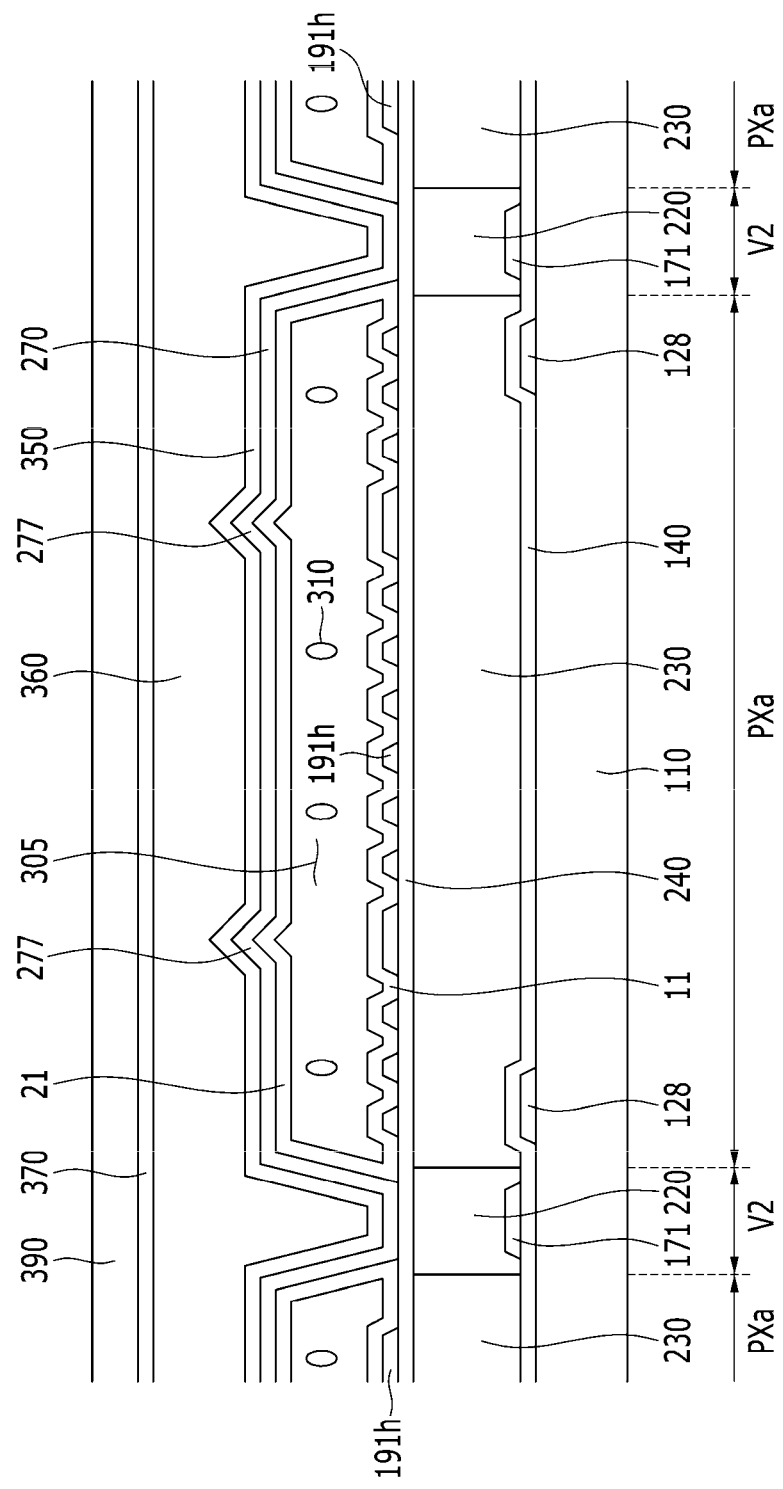
FIG. 5 is a cross-sectional view illustrating the display device of FIG. 3 taken along line V-V according to the exemplary embodiment.

FIG. 3 is a plan view illustrating one pixel of a display device according to an exemplary embodiment, FIG. 4 is a cross-sectional view illustrating the display device of FIG. 3 taken along line IV-IV according to the exemplary embodiment, and FIG. 5 is a cross-sectional view illustrating the display device of FIG. 3 taken along line V-V according to the exemplary embodiment.

As illustrated in FIGS. 3 to 5, a display device according to an exemplary embodiment includes a gate conductor configured by a gate line 121 formed on an insulation substrate 110, a step-down gate line 123, a storage electrode line 125, and the like.

The gate line 121 and the step-down gate line 123 mainly extend in a horizontal direction to transfer gate signals. A first gate electrode 124$h$ and a second gate electrode 124l protruding from the gate line 121 are formed, and a third gate electrode 124$c$ protruding from the step-down gate line 123 is formed. The first gate electrode 124$h$ and the second gate electrode 124I are connected with each other to form one protrusion. In this case, the protruding form of the first, second, and third gate electrodes 124$h$, 124l, and 124$c$ may be variously modified, and the first, second, and third gate electrodes 124$h$, 124l, and 124$c$ may not protrude.

The storage electrode line 125 mainly extends in a horizontal direction to transfer a predetermined voltage such as a common voltage Vcom. The storage electrode line 125 may include a storage extension 126, a pair of vertical portions 128 extending upward to be substantially vertical to the gate line 121, and a horizontal portion 127 connecting the pair of vertical portions 128, but the structure of the storage electrode line 125 is not limited thereto.

A gate insulating layer 140 is formed on the gate conductor 121, 123, and 125. The gate insulating layer 140 may be made of an inorganic insulating material such as silicon nitride (SiNx) and silicon oxide (SiOx). Further, the gate insulating layer 140 may be constituted by a single layer or a multiple layer.

A first semiconductor 154$h$, a second semiconductor 154l, and a third semiconductor 154$c$ are formed on the gate insulating layer 140. The first semiconductor 154$h$ may be positioned on the first gate electrode 124$h$, the second semiconductor 154l may be positioned on the second gate electrode 124I, and the third semiconductor 154$c$ may be positioned on the third gate electrode 124$c$. The first semiconductor 154$h$ and the second semiconductor 154l may be connected to each other, and the second semiconductor 154l and the third semiconductor 154$c$ may be connected to each other. Further, the first semiconductor 154$h$ may be also formed below the data line 171. The first to third semiconductors 154$h$, 154l, and 154$c$ may be made of amorphous silicon, polycrystalline silicon, metal oxide, and the like.

Ohmic contacts (not illustrated) may be further formed on the first to third semiconductors 154$h$, 154l, and 154$c$, respectively.

A data conductor including a data line 171, a first source electrode 173$h$, a second source electrode 173l, a third source electrode 173$c$, a first drain electrode 175$h$, a second drain electrode 175l, and a third drain electrode 175$c$ is formed on the first to third semiconductors 154$h$, 154l, and 154$c$.

The data line 171 transfers a data signal and mainly extends in a vertical direction to cross the gate line 121 and the step-down gate line 123.

The first source electrode 173$h$ protrudes from the data line 171 to be formed on the first gate electrode 124$h$, and the second source electrode 173l is formed on the second gate electrode 124l. The first source electrode 173$h$ and the second source electrode 173l are connected to each other to receive the same data signal from the data line 171. A part of the third source electrode 173$c$ overlaps with a storage extension 126 to form the step-down capacitor Cstd, and the other part overlaps with the third gate electrode 124$c$.

Each of the first drain electrode 175h and the second drain electrode 175l include one wide end portion and the other rod-shaped end portion. The rod-shaped end portions of the first drain electrode 175h and the second drain electrode 175l are partially surrounded by the first source electrode 173h and the second source electrode 173l. One wide end portion of the second drain electrode 175l is again extended to form a third drain electrode 175c which is bent in a 'U'-lettered shape. The third source electrode 173c is partially surrounded by the third drain electrode 175c on the third gate electrode 124c.

The first/second/third gate electrodes 124h/124l/124c, the first/second/third source electrodes 173h/173l/173c, and the first/second/third drain electrodes 175h/175l/175c form first/second/third switching elements Q/Ql/Qc together with the first/second/third semiconductors 154h/154l/154c, respectively. Channels of the first/second/third switching elements Qh/Ql/Qc are formed in the respective semiconductors 154h/154l/154c between the respective source electrodes 173h/173l/173c and the respective drain electrodes 175h/175l/175c.

A passivation layer 180 is formed on the data conductor 171, 173h, 173l, 173c, 175h, 175l, and 175c and the semiconductors 154h, 154l, and 154c exposed between the respective source electrodes 173h/173l/173c and the respective drain electrodes 175h/175l/175c. The passivation layer 180 may be made of an organic insulating material or an inorganic insulating material, and may be formed in a single layer or a multiple layer.

A color filter 230 in each pixel PX is formed on the passivation layer 180. Each color filter 230 may display one of the primary colors such as three primary colors of red, green and blue. However, the color filter 230 is not limited to the three primary colors of red, green and blue, but may display one of cyan, magenta, yellow, and white-based colors. Unlike those illustrated above, the color filter 230 may be elongated in a column direction along a space between the adjacent data lines 171.

A light blocking member 220 is formed in a region between the adjacent color filters 230. The light blocking member 220 is formed on a boundary of the pixel PX and the switching elements Qh, Ql, and Qc to prevent light leakage. That is, the light blocking member 220 may be formed at the first valley V1 and the second valley V2. The color filter 230 and the light blocking member 220 may overlap with each other in a partial region.

A first insulating layer 240 may be further formed on the color filter 230 and the light blocking member 220. The first insulating layer 240 may be made of an inorganic insulating material such as silicon nitride (SiNx) and silicon oxide (SiOx). The first insulating layer 240 serves to protect the color filter 230 made of the organic material and the light blocking member 220, and may be omitted if necessary.

In the first insulating layer 240, the light blocking member 220, and the passivation layer 180, a plurality of first contact holes 185h and a plurality of second contact holes 185l, which expose the wide end portion of the first drain electrode 175h and the wide end portion of the second drain electrode 175l, respectively, are formed.

A pixel electrode 191 is formed on the first insulating layer 240. The pixel electrode 191 includes a first subpixel electrode 191h and a second subpixel electrode 191l which are separated from each other with the gate line 121 and the step-down gate line 123 therebetween, and disposed above and below the pixel PX based on the gate line 121 and the step-down gate line 123 to be adjacent to each other in a column direction. That is, the first subpixel electrode 191h and the second subpixel electrode 191l are separated from each other with the first valley V1 therebetween, the first subpixel electrode 191h is positioned in the first subpixel PXa, and the second subpixel electrode 191l is positioned in the second subpixel PXb.

The first subpixel electrode 191h and the second subpixel electrode 191l are connected with the first drain electrode 175h and the second drain electrode 175l through the first contact hole 185h and the second contact hole 185l, respectively. Accordingly, when the first switching element Qh and the second switching element Ql are turned on, the first switching element Qh and the second switching element Ql receive data voltages from the first drain electrode 175h and the second drain electrode 175l.

The pixel electrode 191 includes cross stems 195 and 197 configured by a horizontal stem 195 and a vertical stem 197, and a central pattern 198 formed at a cross point of the horizontal stem 195 and the vertical stem 197. The horizontal stem 195 may be formed in parallel to the gate line 121, and the vertical stem 197 may be formed in parallel to the data line 171. The central pattern 198 may be formed in a rhombus shape. Further, the pixel electrode 191 further includes a minute branch 199 extending from the horizontal stem 195, the vertical stem 197, and the central pattern 198.

One horizontal stem 195 and one vertical stem 197 cross each other to form one unit electrode, and the pixel electrode 191 may include a plurality of unit electrodes. The adjacent unit electrodes may be connected to each other. For example, as illustrated in FIG. 3, the first subpixel electrode 191h may be configured by four unit electrodes, and the second subpixel electrode 191l may be configured by six unit electrodes. The four unit electrodes configuring the first subpixel electrode 191h are connected to each other, and the six unit electrodes configuring the second subpixel electrode 191l are connected to each other. The horizontal stems 195 of the adjacent two unit electrodes may be connected to each other, or the vertical stems 197 of the adjacent two unit electrodes may be connected to each other.

The pixel electrode 191 may be made of a transparent metal material such as indium tin oxide (ITO) and indium zinc oxide (IZO).

The shape of the pixel electrode 191 illustrated in FIG. 3 is described above, but the shape of the pixel electrode 191 is not limited thereto and may be variously modified. For example, the number of unit electrodes configuring one pixel electrode 191 may be changed, and the shape of the unit electrodes may be modified.

A common electrode 270 is formed on the pixel electrode 191 so as to be spaced apart from the pixel electrode 191 at a predetermined distance. A microcavity 305 is formed between the pixel electrode 191 and the common electrode 270. That is, the microcavity 305 is surrounded by the pixel electrode 191 and the common electrode 270. The common electrode 270 is formed in a row direction, and formed on the microcavity 305 and at the second valley V2. The common electrode 270 is formed to cover an upper surface and a side of the microcavity 305. A width and an area of the microcavity 305 may be variously modified according to a size and resolution of the display device.

The common electrode 270 may be made of a transparent metal material such as indium tin oxide (ITO) and indium zinc oxide (IZO). A predetermined voltage may be applied to the common electrode 270, and an electric field may be generated between the pixel electrode 191 and the common electrode 270.

The common electrode 270 includes protrusions 275, 277, and 278 protruding upwards at a portion contacting the upper surface of the microcavity 305. Both an upper surface and a lower surface of the common electrode 270 are formed in protruding shapes at the protrusions 275, 277, and 278. Since the protrusions 275, 277, and 278 have shapes protruding upwards from another portion of the common electrode 270, a height of the microcavity 305 positioned below the protrusions 275, 277, and 278 is larger than a height of a microcavity 305 of a portion where the protrusions 275, 277, and 278 are not formed. Accordingly, a magnitude of an electric field formed between the common electrode 270 and the pixel electrode 191 is reduced at the portion where the protrusions 275, 277, and 278 are not formed.

A cross-sectional shape of the protrusions 275, 277, and 278 may have a substantially triangular shape as illustrated in FIG. 5. In this case, the protrusions 275, 277, and 278 may have an isosceles triangle or an equilateral triangle.

A planar shape of the protrusions 275, 277, and 278 may have a cross shape as illustrated in FIG. 3. The common electrode 270 includes cross protrusions 275 and 277 configured by a horizontal protrusion 275 and a vertical protrusion 277. The horizontal protrusion 275 may be formed in parallel to the gate line 121, and the vertical protrusion 277 may be formed in parallel to the data line 171. Further, the common electrode 270 further includes a central protrusion 278 formed at a cross point of the horizontal protrusion 275 and the vertical protrusion 277. The central protrusion 278 may be formed in a rhombus shape.

One horizontal protrusion 275 and one vertical protrusion 277 cross each other to form one unit electrode, and one unit electrode of the common electrode 270 overlaps with one unit electrode of the pixel electrode 191. The protrusions 275, 277, and 278 of the common electrode 270 may overlap with the horizontal stem 195, the vertical stem 197, and the central pattern 198 of the pixel electrode 191.

A liquid crystal layer constituted by liquid crystal molecules 310 is formed in the microcavity 305 positioned between the pixel electrode 191 and the common electrode 270. The liquid crystal molecules 310 have negative dielectric anisotropy, and may stand up in a vertical direction to the substrate 110 while the electric field is not applied. That is, vertical alignment may be performed.

A first alignment layer 11 is formed on the pixel electrode 191. The first alignment layer 11 may also be formed on the first insulating layer 240 which is not covered by the pixel electrode 191.

A second alignment layer 21 is formed below the common electrode 270 to face the first alignment layer 11.

The first alignment layer 11 and the second alignment layer 21 may be formed as vertical alignment layers, and made of materials such as polyamic acid, polysiloxane, and polyimide. The first and second alignment layers 11 and 21 may be connected to each other at the edge of the pixel PX.

The first subpixel electrode 191$h$ and the second subpixel electrode 191$l$ to which the data voltage is applied generate an electric field together with a common electrode 270 to determine directions of the liquid crystal molecules 310 positioned in the microcavity 305 between two electrodes 191 and 270. As such, luminance of light passing through the liquid crystal layer varies according to the determined directions of the liquid crystal molecules 310.

The first subpixel electrode 191$h$ and the common electrode 270 form the first liquid crystal capacitor Clch together with the liquid crystal layer therebetween, and the second subpixel electrode 191$l$ and the common electrode 270 form the second liquid crystal capacitor Clcl together with the liquid crystal layer therebetween. As a result, even after the first and second switching elements Qh and Ql are turned off, the applied voltage is maintained.

The first and second subpixel electrodes 191$h$ and 191$l$ overlap with the storage electrode line 125 to form the first and second storage capacitors Csth and Cstl, and each of the first and second storage capacitors Csth and Cstl reinforces a voltage storage capacity of each of the first and second liquid crystal capacitors Clch and Clcl.

The storage extension 126 and a wide end portion 177$c$ of the third source electrode 173$c$ overlap with each other with the gate insulating layer 140 therebetween to form the step-down capacitor Cstd.

As describe above, the first subpixel electrode 191$h$ and the second subpixel electrode 191$l$ to which the data voltages are applied generate the electric field together with the common electrode 270, and as a result, the liquid crystal molecules 310 of the liquid crystal layer which are aligned so as to be vertical to the surfaces of the two electrodes 191 and 270 while the electric field is not applied are tilted in a horizontal direction to the surfaces of the two electrodes 191 and 270, and luminance of light passing through the liquid crystal layer varies according to the tilted degree of the liquid crystal molecules 310.

The edge of the minute branch 199 of the pixel electrode 191 and the cross protrusions 275 and 277 of the common electrode 270 generate a fringe field. In detail, the liquid crystal molecules 310 positioned around the edge of the minute branch 199 are tilted toward the inside of the minute branch 199 by the fringe field. Further, the liquid crystal molecules 310 positioned around the edge of the cross protrusions 275 and 277 of the common electrode 270 are tilted toward the inside of the cross protrusions 275 and 277 by the fringe field.

As a result, the liquid crystal molecules 310 are tilted substantially in a parallel direction to the minute branch 199 toward the central portion of the cross stems 195 and 197 by the fringe field. The liquid crystal molecules 310 are divided into four subregions according to a tilt direction of the liquid crystal molecules 310. As such, in the exemplary embodiment, the tilt directions of the liquid crystal molecules 310 are varied by forming the minute branch 199 at the pixel electrode 191 and forming the cross protrusions 275 and 277 on the common electrode 270, thereby widening a viewing angle.

A second insulating layer 350 may be further formed on the common electrode 270. The second insulating layer 350 may be made of an inorganic insulating material such as silicon nitride (SiNx) and silicon oxide (SiOx), and may be omitted if necessary. Since the protrusions 275, 277, and 278 are formed on the common electrode 270, protrusions are formed even on the second insulating layer 350.

A roof layer 360 is formed on the second insulating layer 350. The roof layer 360 may be made of an organic material. The roof layer 360 is formed in a row direction, and formed on the microcavity 305 and at the second valley V2. The roof layer 360 is formed to cover an upper surface and a side of the microcavity 305. The roof layer 360 is hardened by a curing process to serve to maintain the shape of the microcavity 305. The roof layer 360 is formed to be spaced apart from the pixel electrode 191 with the microcavity 305 therebetween.

The common electrode 270 and the roof layer 360 are formed to expose the side of the edge of the microcavity 305, and portions where the microcavity 305 is not covered by the common electrode 270 and the roof layer 360 are called injection holes 307$a$ and 307$b$. The injection holes 307$a$ and 307$b$ include a first injection hole 307$a$ extending to and exposing the side of the first edge of the microcavity 305 and a second injection hole 307$b$ extending to and exposing the side of the second edge of the microcavity 305. The first edge and the second edge face each other, and for example, on a plan view, the first edge may be an upper edge of the microcavity 305, and the second edge may be a lower edge of the microcavity 305. Since the microcavity 305 is exposed by the injection holes 307a and 307b, an aligning agent, a liquid crystal material, or the like may be injected into the microcavity 305 through the injection holes 307a and 307b.

A third insulating layer 370 may be further formed on the roof layer 360. The third insulating layer 370 may be made of an inorganic insulating material such as silicon nitride (SiNx) and silicon oxide (SiOx). The third insulating layer 370 may be formed to cover an upper surface and a side of the roof layer 360. The third insulating layer 370 serves to protect the roof layer 360 made of an organic material, and may be omitted if necessary.

An encapsulation layer 390 is formed on the third insulating layer 370. The encapsulation layer 390 is formed to cover the injection holes 307a and 307b by which a part of the microcavity 305 is exposed outside. That is, the encapsulation layer 390 may seal the microcavity 305 so that the liquid crystal molecules 310 formed in the microcavity 305 are not discharged outside. Since the encapsulation layer 390 contacts the liquid crystal molecules 310, the encapsulation layer 390 may be made of a material which does not react with liquid crystal molecules 310. For example, the encapsulation layer 390 may be made of parylene and the like.

The encapsulation layer 390 may be formed by a multi-layer such as a double layer and a triple layer. The double layer is configured by two layers made of different materials. The triple layer is configured by three layers, and materials of adjacent layers are different from each other. For example, the encapsulation layer 390 may include a layer made of an organic insulating material and a layer made of an inorganic insulating material.

Although not illustrated, polarizers may be further formed on upper and lower sides of the display device. The polarizers may be configured by a first polarizer and a second polarizer. The first polarizer may be attached onto the lower side of the substrate 110, and the second polarizer may be attached onto the encapsulation layer 390.

The layout form of the pixel, the connection relationship of the respective switching elements, and the shape of the pixel electrode described above are just exemplified, and the embodiments are not limited thereto and may be variously modified.

Next, various shapes of protrusions of a common electrode of a display device according to an exemplary embodiment will be described below with reference to FIGS. 6 to 10.

FIGS. 6 to 10 are cross-sectional views illustrating a display device according to an exemplary embodiment.

Figure 6:
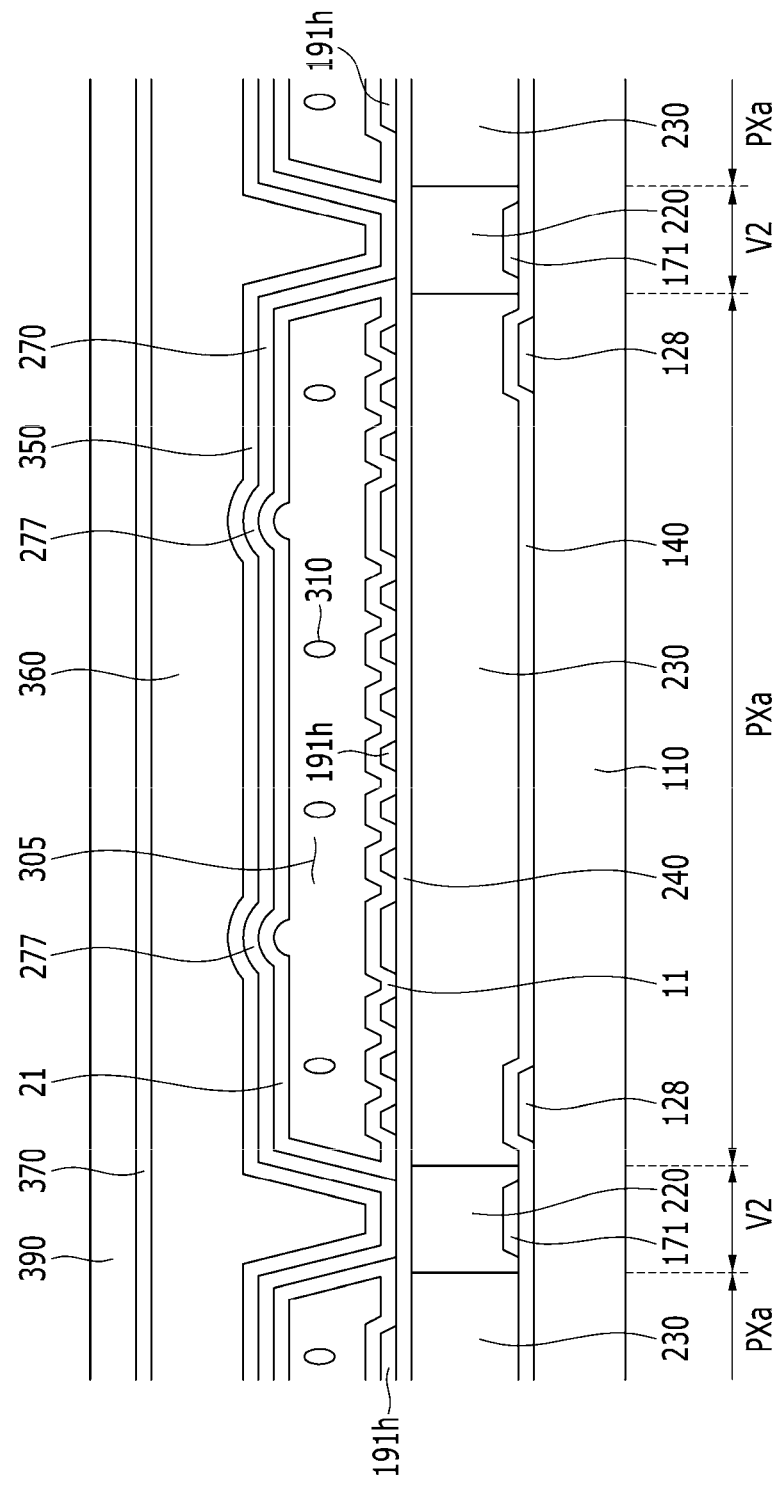
FIGS. 6, 7, 8, 9, 10 are cross-sectional views illustrating a display device according to an exemplary embodiment.

First, as illustrated in FIG. 6, the common electrode 270 includes a protrusion 277 which protrudes upwards from a portion contacting the upper surface of the microcavity 305. A cross-sectional shape of the protrusion 277 may be formed substantially in a semicircular shape. The shape of the second insulating layer 350 is modified according to the shape of the protrusion 277 of the common electrode 270. That is, a portion of the second insulating layer 350 positioned on the protrusion 277 of the common electrode 270 protrudes, and the shape thereof is formed in a semicircular shape.

Figure 7:
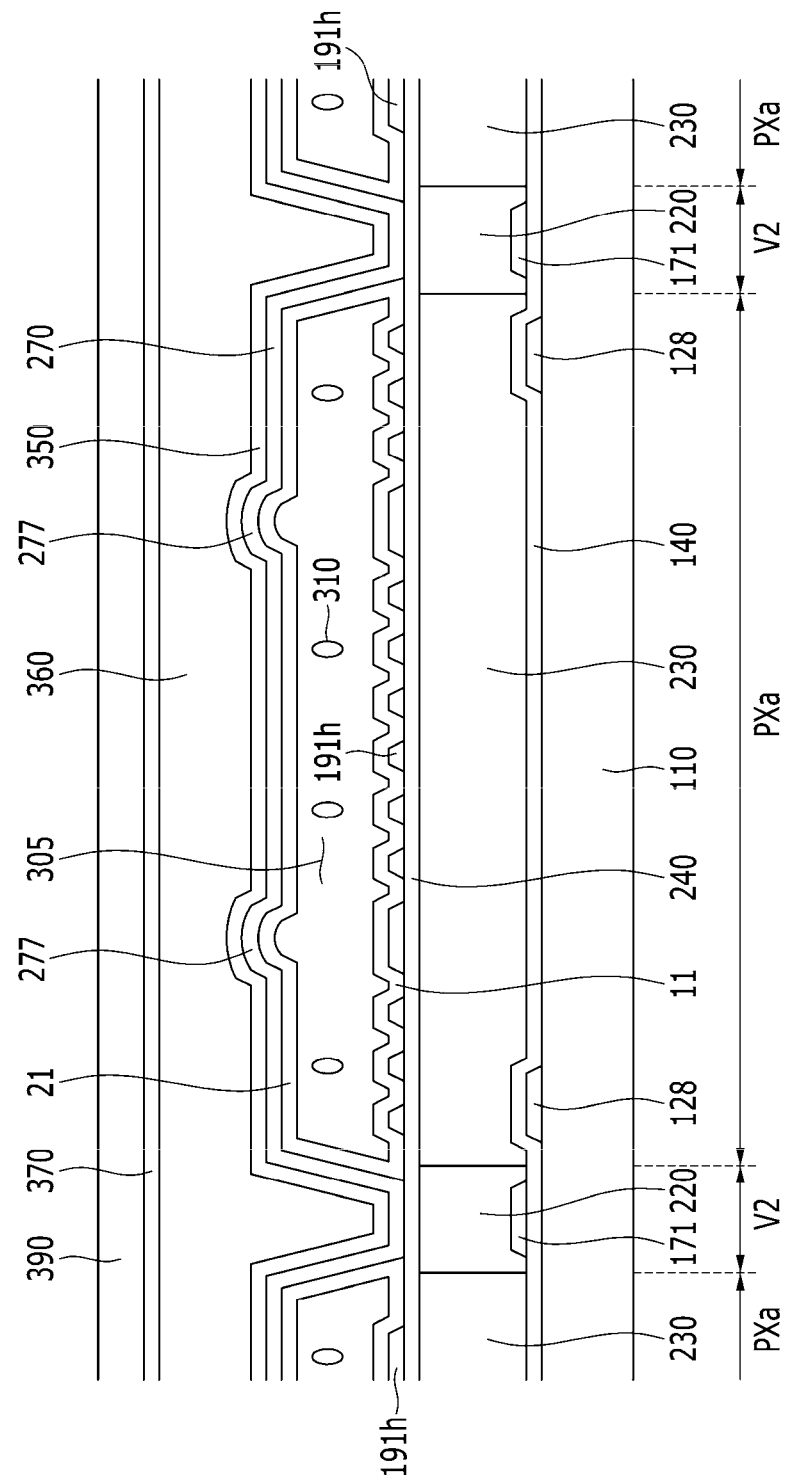
Figure 8:
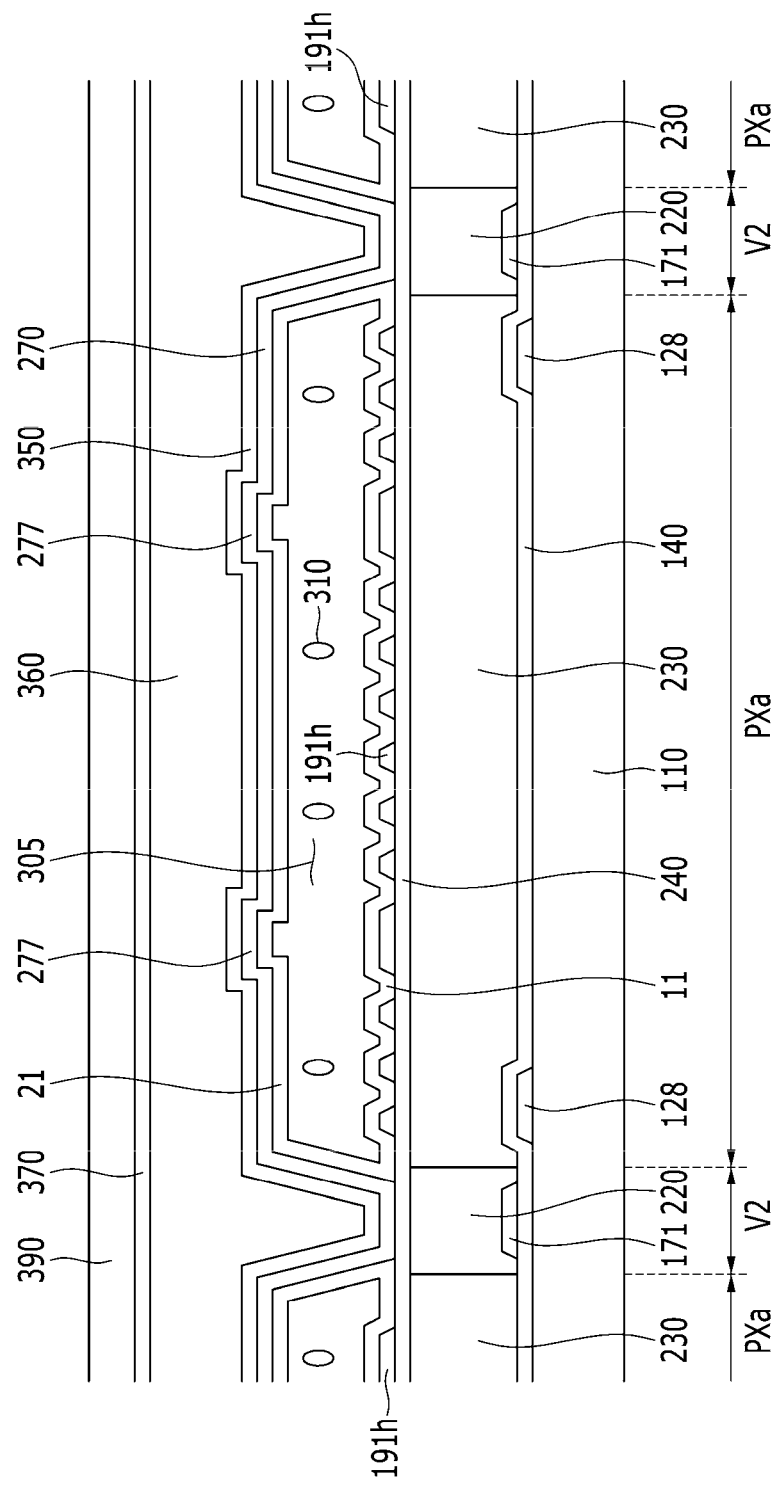
Figure 9:
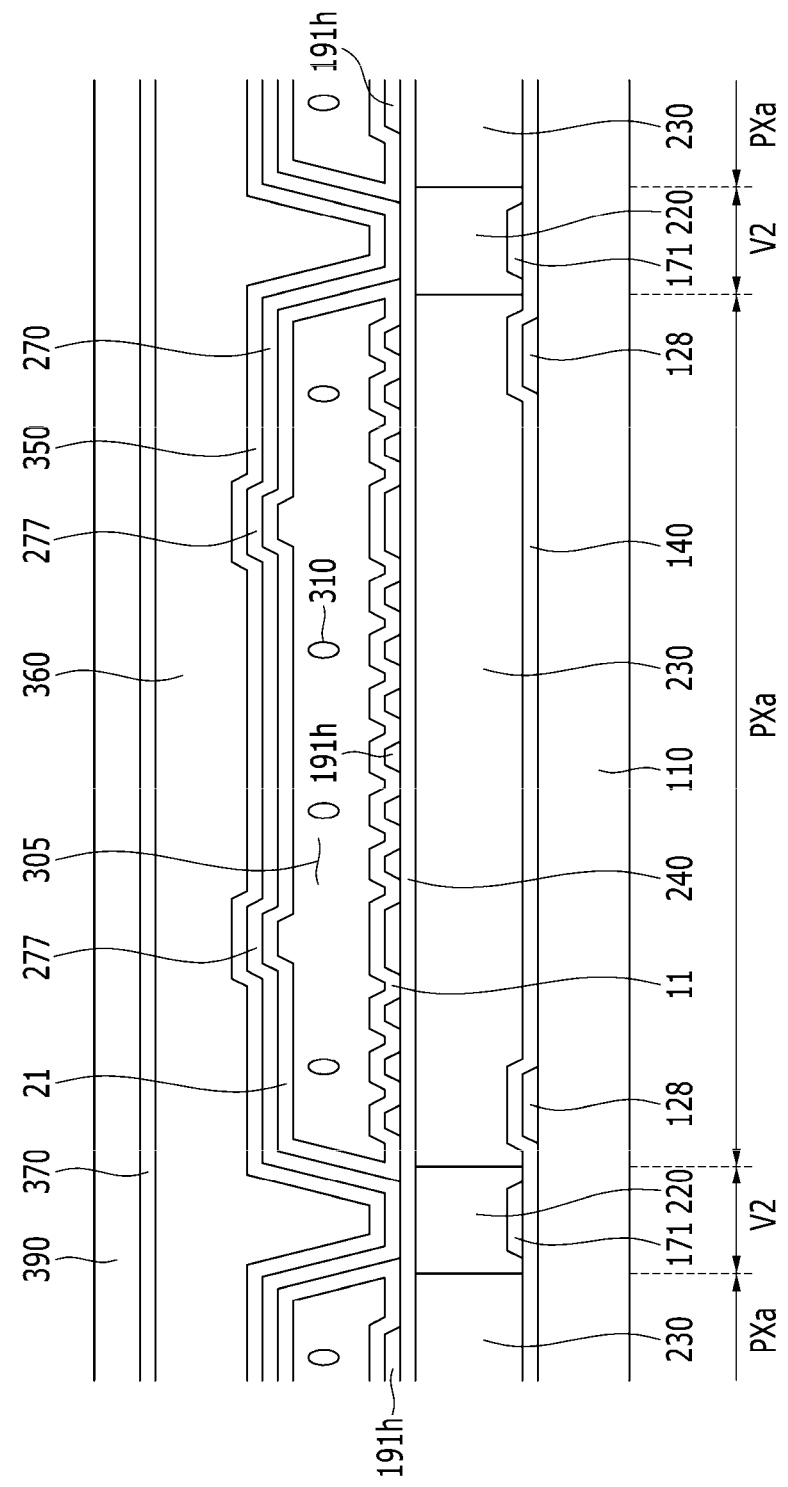
Figure 10:
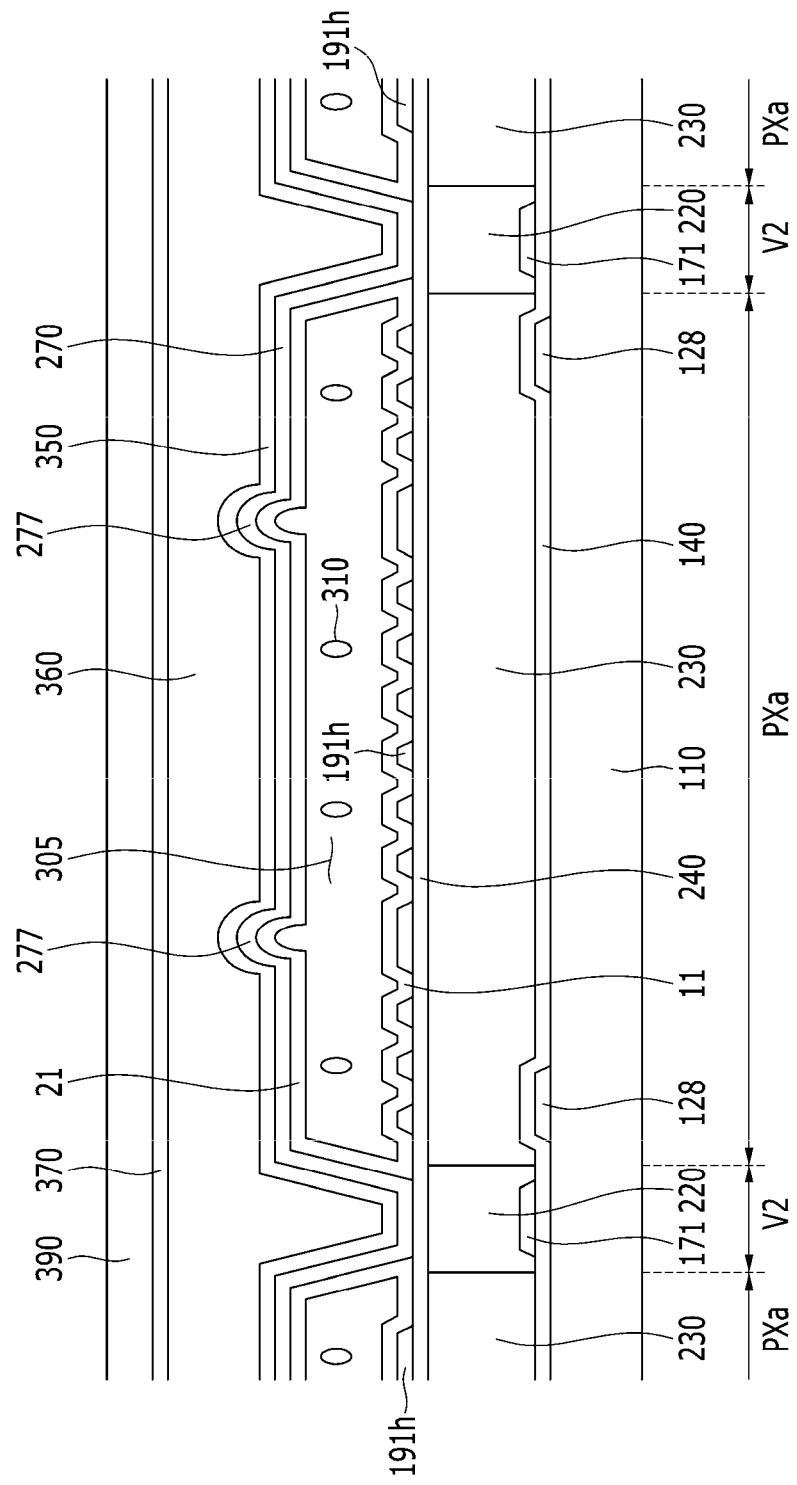

The cross-sectional shape of the protrusion 277 of the common electrode 270 may be variously modified. For example, as illustrated in FIG. 7, the cross-sectional shape of the protrusion 277 of the common electrode 270 may be formed in a shape where an upper side of a trapezoid is modified to be a curved line. Further, as illustrated in FIG. 8, the cross-sectional shape of the protrusion 277 of the common electrode 270 may be formed in a quadrangular shape. Particularly, the cross-sectional shape of the protrusion 277 of the common electrode 270 may be formed in a rectangular or square shape. Further, as illustrated in FIG. 9, the cross-sectional shape of the protrusion 277 of the common electrode 270 may be formed in a trapezoid shape. Further, as illustrated in FIG. 10, the cross-sectional shape of the protrusion 277 of the common electrode 270 may be formed in a semioval shape.

Next, a display device according to an exemplary embodiment will be described below with reference to FIGS. 11 to 13.

Figure 11:
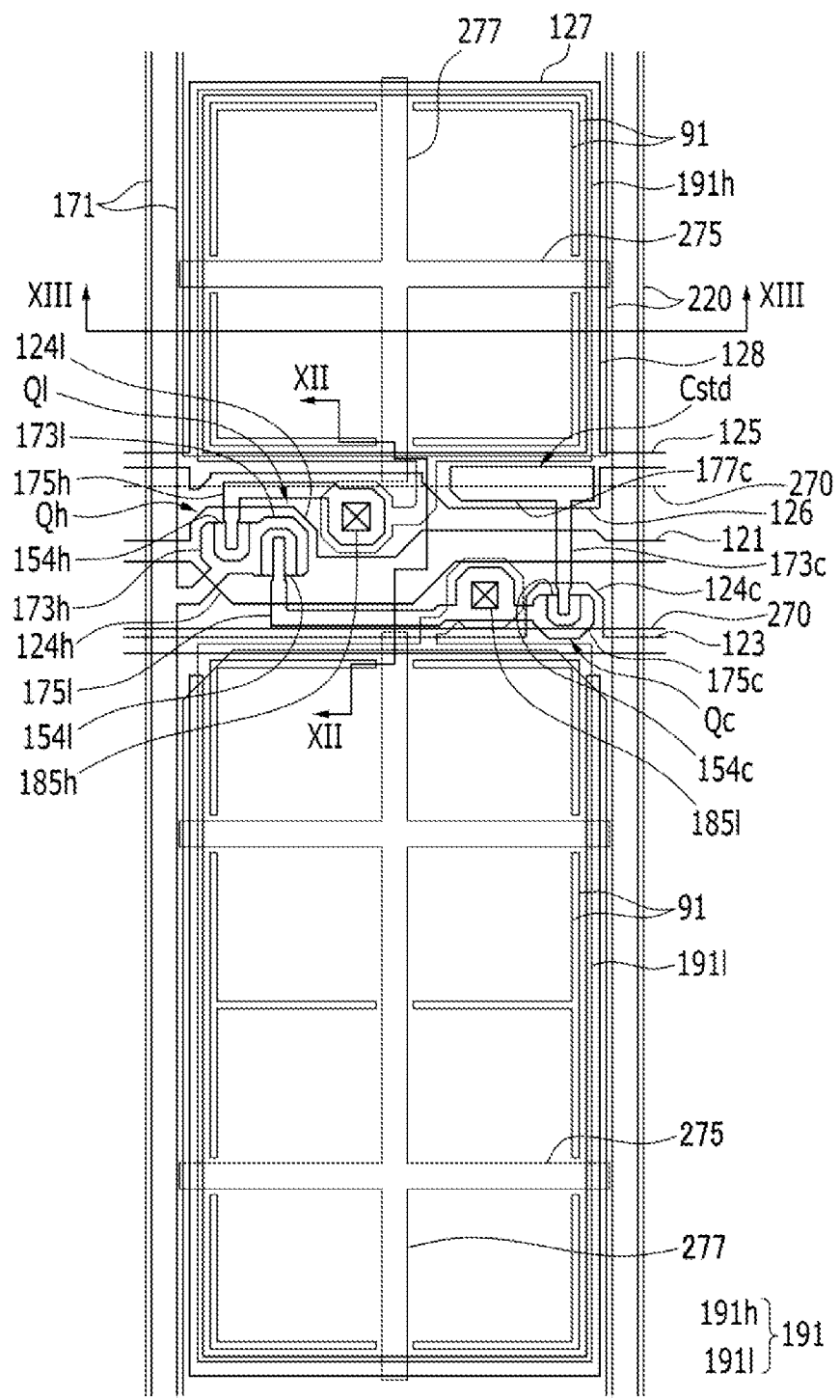
FIG. 11 is a plan view illustrating a display device according to an exemplary embodiment.
Figure 12:
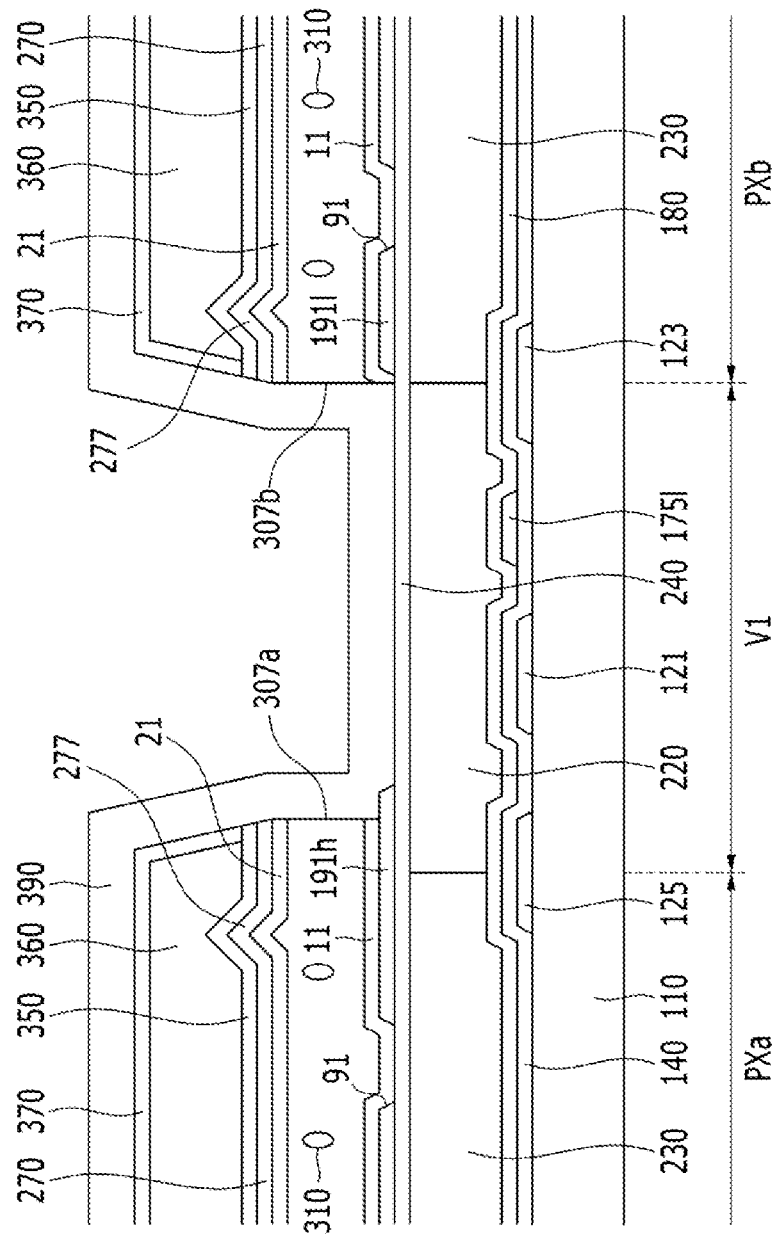
FIG. 12 is a cross-sectional view illustrating the display device of FIG. 11 taken along line XII-XII according to the exemplary embodiment.
Figure 13:
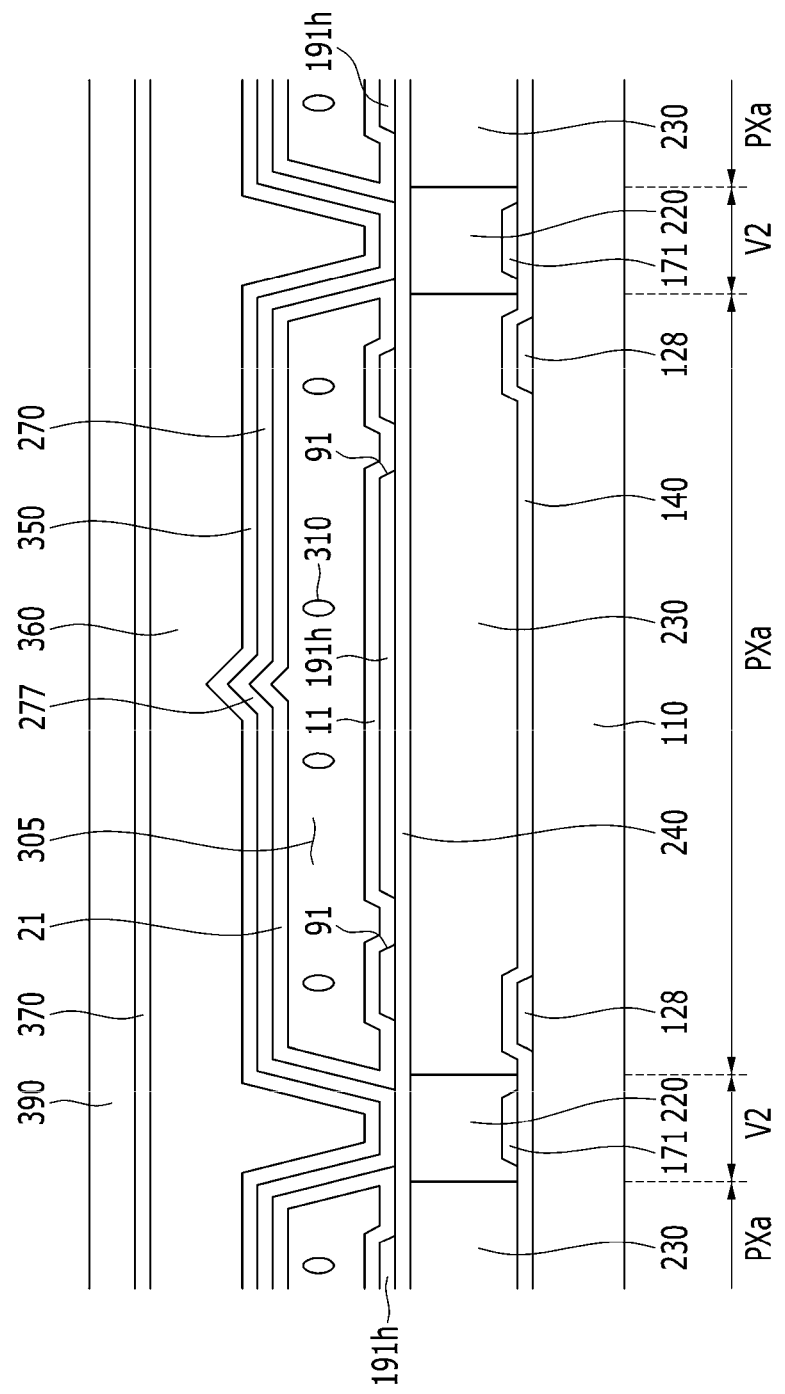
FIG. 13 is a cross-sectional view illustrating the display device of FIG. 11 taken along line XIII-XIII according to the exemplary embodiment.

Since the display device according to an exemplary embodiment illustrated in FIGS. 11 to 13 is almost the same as the display device according to the exemplary embodiment illustrated in FIGS. 1 to 5, the description thereof is omitted. The exemplary embodiment is different from the above exemplary embodiment in that a pixel electrode has a planar shape, and hereinafter, will be described in more detail.

FIG. 11 is a plan view illustrating a display device according to an exemplary embodiment, FIG. 12 is a cross-sectional view illustrating the display device of FIG. 11 taken along line XII-XII according to the exemplary embodiment, and FIG. 13 is a cross-sectional view illustrating the display device of FIG. 11 taken along line XIII-XIII according to the exemplary embodiment.

Equally to the above exemplary embodiment, on the substrate 110, the gate line 121, the data line 171, and the plurality of switching elements Qh, Ql, and Qc are formed, and the pixel electrode 191 is formed.

In the above exemplary embodiment, the pixel electrode 191 includes a plurality of minute branches, but in the exemplary embodiment, there is a difference in that the pixel electrode 191 has a planar shape. The pixel electrode 191 has a substantially quadrangular shape.

The pixel electrode 191 includes a cutout 91 which is adjacent to at least a part of the edges of the pixel electrode 191 to be formed along the edge thereof. A fringe field is formed even at the edge of the pixel area by forming the cutout 91 along the edge of the pixel electrode 191, thereby controlling alignment of the liquid crystal molecules 310 in a desired direction.

The pixel electrode 191 includes a first subpixel electrode 191h and a second subpixel electrode 191l, and the first subpixel electrode 191h and the second subpixel electrode 191l are connected with a first drain electrode 175h and a second drain electrode 175l through the first contact hole 185h and the second contact hole 185l, respectively.

The common electrode 270 includes protrusions 275 and 277 protruding upwards at a portion contacting the upper surface of the microcavity 305. A cross-sectional shape of the protrusions 275 and 277 may have a substantially triangular shape as illustrated in FIGS. 12 and 13. A planar shape of the protrusions 275 and 277 may have a cross shape as illustrated in FIG. 11. The common electrode 270 includes cross protrusions 275 and 277 configured by a horizontal protrusion 275 and a vertical protrusion 277.

Ends of the protrusions 275 and 277 of the common electrode 270 protrude above the edge of the pixel electrode 191, respectively. As such, the protrusions 275 and 277 of the common electrode 270 protrude above the edge of the pixel electrode 191, and as a result, the fringe field stably influences the edge of the pixel PX to control the alignment of the liquid crystal molecules 310 in a desired direction even at the edge of the pixel PX.

One horizontal protrusion 275 and one vertical protrusion 277 of the common electrode 270 cross each other to form one unit electrode, and the cutout 91 of the pixel electrode 191 is formed along the edge of one unit electrode. One unit electrode may be formed in the first subpixel PXa, and two unit electrodes may be formed in the second subpixel PXb. One unit electrode is divided into four subregions by the cross protrusions 275 and 277 of the common electrode 270, and tilt directions of the liquid crystal molecules 310 are different for every subregion. As such, in the exemplary embodiment, the tilt directions of the liquid crystal molecules 310 are varied by forming the cutout 91 at the pixel electrode 191 and forming the cross protrusions 275 and 277 on the common electrode 270, thereby widening a viewing angle.

Next, a manufacturing method of a display device according to an exemplary embodiment will be described below with reference to FIGS. 14 to 17. Further, the manufacturing method will be described with reference to FIGS. 1 to 5 together.

FIGS. 14 to 17 are process cross-sectional views illustrating a manufacturing method of a display device according to an exemplary embodiment.

Figure 14:
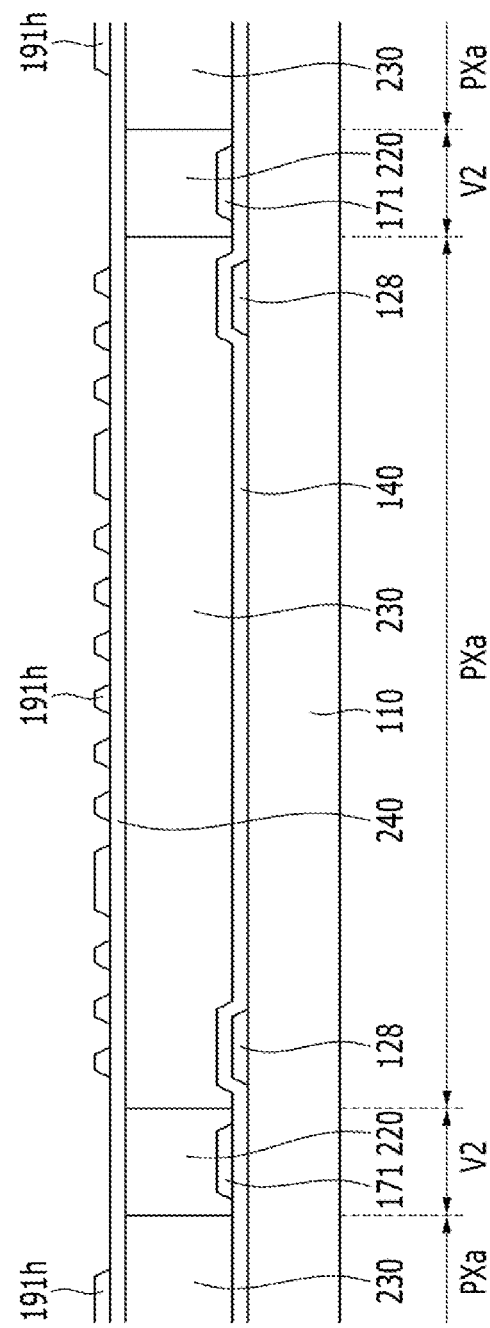
FIGS. 14, 15, 16, 17 are process cross-sectional views illustrating a manufacturing method of a display device according to an exemplary embodiment.

First, as illustrated in FIG. 14, a gate line 121 and a step-down gate line 123 extending in one direction are formed on a substrate 110 made of glass or plastic, and a first gate electrode 124h, a second gate electrode 124l, and a third gate electrode 124c which protrude from the gate line 121 are formed.

Further, a storage electrode line 125 may be formed together so as to be spaced apart from the gate line 121, the step-down gate line 123, and the first to third gate electrodes 124h, 124l, and 124c.

Next, a gate insulating layer 140 is formed on the entire surface of the substrate 110 including the gate line 121, the step-down gate line 123, the first to third gate electrodes 124h, 124l, and 124c, and the storage electrode line 125 by using an inorganic insulating material such as silicon oxide (SiOx) or silicon nitride (SiNx). The gate insulating layer 140 may be formed by a single layer or a multiple layer.

Next, a first semiconductor 154h, a second semiconductor 154l, and a third semiconductor 154c are formed by depositing a semiconductor material such as amorphous silicon, polycrystalline silicon, and metal oxide on the gate insulating layer 140 and then patterning the deposited semiconductor material. The first semiconductor 154h may be positioned on the first gate electrode 124h, the second semiconductor 154l may be positioned on the second gate electrode 124l, and the third semiconductor 154c may be positioned on the third gate electrode 124c.

Next, a data line 171 extending in the other direction is formed by depositing a metal material and then patterning the deposited metal material. The metal material may be formed by a single layer or a multiple layer.

Further, a first source electrode 173h protruding above the first gate electrode 124h from the data line 171, and a first drain electrode 175h spaced apart from the first source electrode 173h are formed together. Further, a second source electrode 173l connected with the first source electrode 173h, and a second drain electrode 175l spaced apart from the second source electrode 173l are formed together. Further, a third source electrode 173c extended from the second drain electrode 175l, and a third drain electrode 175c spaced apart from the third source electrode 173c are formed together.

The first to third semiconductors 154h, 154l, and 154c, the data line 171, the first to third source electrodes 173h, 173l, and 173c, and the first to third drain electrodes 175h, 175l, and 175c may be formed by sequentially depositing a semiconductor material and a metal material and then patterning the semiconductor material and the metal material at the same time. In this case, the first semiconductor 154h may be formed below the data line 171.

The first/second/third gate electrodes 124h/124l/124c, the first/second/third source electrodes 173h/173l/173c, and the first/second/third drain electrodes 175h/175l/175c form first/second/third switching elements Qh/Ql/Qc together with the first/second/third semiconductors 154h/154l/154c, respectively.

Next, a passivation layer 180 is formed on the data line 171, the first to third source electrodes 173h, 173l, and 173c, the first to third drain electrodes 175h, 175l, and 175c and the semiconductors 154h, 154l, and 154c exposed between the respective source electrodes 173h/173l/173c and the respective drain electrodes 175h/175l/175c. The passivation layer 180 may be made of an organic insulating material or an inorganic insulating material, and may be formed in a single layer or a multiple layer.

Next, a color filter 230 is formed on the passivation layer 180. The color filters 230 are formed in the first subpixel PXa and the second subpixel PXb, and may not be formed at the first valley V1. The color filters 230 having the same color may be formed in a column direction of the plurality of pixels PX. In the case of forming the color filters 230 having three colors, a first colored filter 230 may be first formed and then a second colored filter 230 may be formed by shifting a mask. Next, the second colored filter 230 may be formed and then a third colored filter may be formed by shifting a mask.

Next, a light blocking member 220 is formed on a boundary of each pixel PX on the passivation layer 180 and the switching element.

Hereinabove, the light blocking member 220 is formed after forming the color filters 230, but is the embodiments are not limited thereto, and the light blocking member 220 is first formed and then the color filters 230 may be formed.

Next, a first insulating layer 240 made of an inorganic insulating material such as silicon nitride (SiNx) and silicon oxide (SiOx) is formed on the color filter 230 and the light blocking member 220.

Next, a first contact hole 185h is formed by etching the passivation layer 180, the light blocking member 220, and the first insulating layer 240 so as to expose at least a part of the first drain electrode 175h, and a second contact hole 185l is formed so as to expose at least a part of the second drain electrode 175l. In this case, the passivation layer 180, the light blocking member 220, and the first insulating layer 240 may be simultaneously patterned, separately patterned through a separate process, or only a part thereof may be simultaneously patterned.

A pixel electrode 191 in the pixel PX is formed on the first insulating layer 240 by depositing and patterning a transparent metal material such as indium tin oxide (ITO) and indium zinc oxide (IZO). The pixel electrode 191 includes a first subpixel electrode 191h positioned in the first subpixel PXa, and a second subpixel electrode 191l positioned in the second subpixel PXb. The first subpixel electrode 191h and the second subpixel electrode 191l may be separated from each other with the first valley V1 therebetween.

The pixel electrode 191 may be patterned to include cross stems 195 and 197 configured by a horizontal stem 195 and a vertical stem 197, and a central pattern 198 formed at a cross point of the horizontal stem 195 and the vertical stem 197. Further, the pixel electrode 191 may be patterned so as to further include a minute branch 199 extending from the horizontal stem 195, the vertical stem 197, and the central pattern 198.

Figure 15:
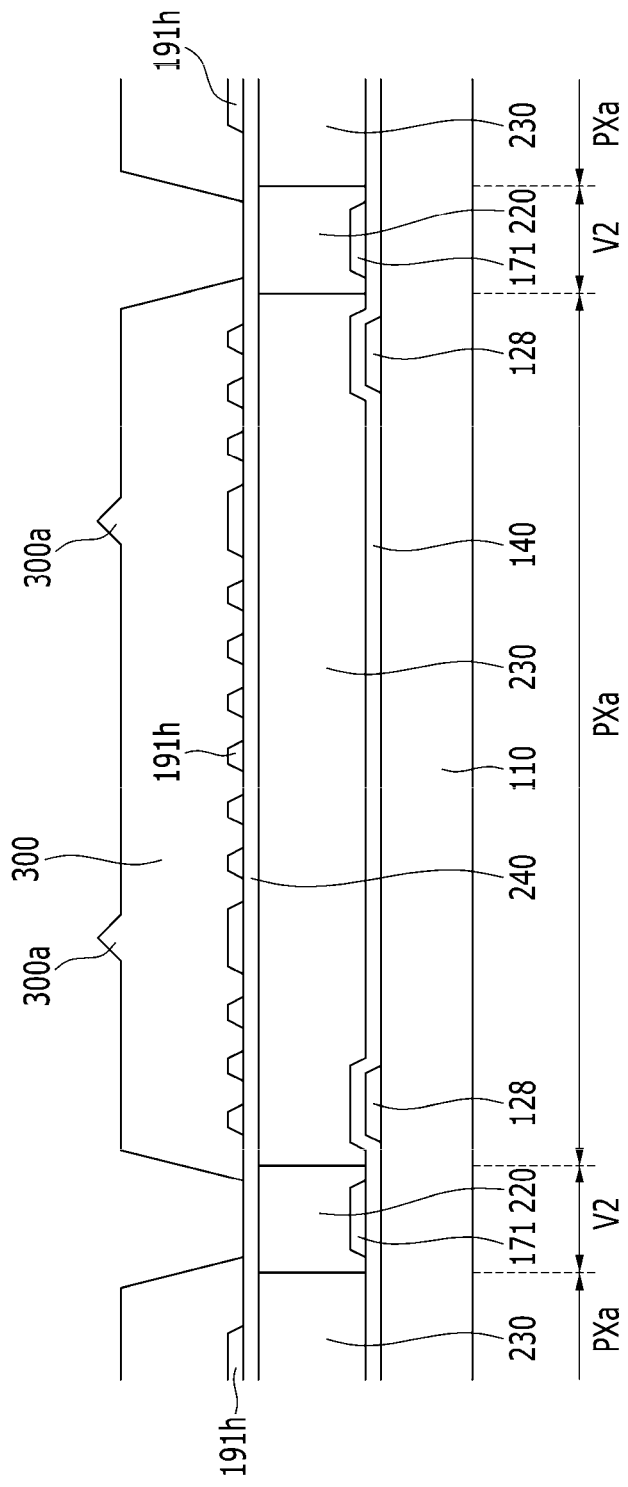

As illustrated in FIG. 15, a sacrificial layer 300 is formed by coating a photosensitive organic material on the pixel electrode 191 and performing a photolithography process. The sacrificial layer 300 may be formed in a column direction. The sacrificial layer 300 is formed in each pixel PX and the first valley V1, and may not be formed in the second valley V2.

The sacrificial layer 300 may be formed to include a protrusion 300a. The protrusion 300a protrudes upwards from an upper surface of the sacrificial layer 300. A thickness of the sacrificial layer 300 at a portion where the protrusion 300a is formed is larger than a thickness of the sacrificial layer 300 at a portion where the protrusion 300a is not formed.

The cross-sectional shape of the protrusion 300a may have a substantially triangular shape. In this case, the protrusion 300a may have an isosceles triangular shape or an equilateral triangular shape. The cross-sectional shape of the protrusion 300a may be variously modified, and for example, may have a semicircular shape, a quadrangular shape, a trapezoid shape, a semioval shape, and the like. Further, an upper side of the trapezoid may have a shape which is modified to be a curved line.

The planar shape of the protrusion 300a may have a cross shape. Referring to FIG. 3, the planar shape of the protrusion 300a may have the same shape as the planar shape of the protrusions 275, 277, and 278 of the common electrode 270.

The sacrificial layer 300 may be formed to include the protrusion 300a by using a slit mask or a halftone mask. By properly designing the shape of the mask, the shape of the protrusion 300a may be variously modified. For example, a portion of the mask corresponding to the protrusion 300a may comprise multi slits having different widths, and a width of the slit may be gradually widened toward both edges from the center.

Figure 16:
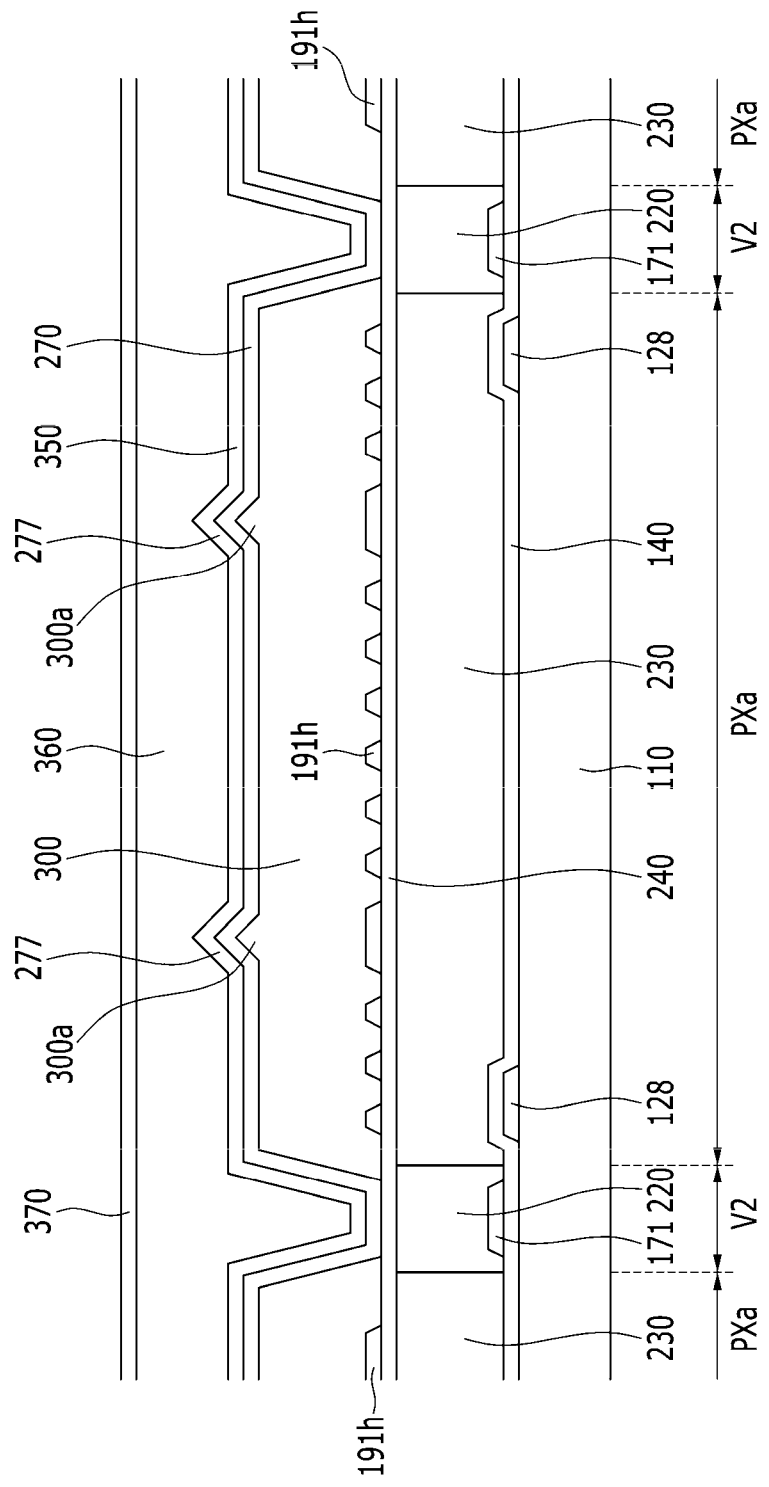

As illustrated in FIG. 16, a common electrode 270 is formed by depositing a transparent metal material such as indium tin oxide (ITO) and indium zinc oxide (IZO) on the sacrificial layer 300.

The common electrode 270 includes protrusions 275, 277, and 278 protruding upwards from a portion contacting the upper surface of the sacrificial layer 300. Both an upper surface and a lower surface of the common electrode 270 are formed in protruding shapes at the protrusions 275, 277, and 278.

The cross-sectional shape of the protrusions 275, 277, and 278 may have a substantially triangular shape. The shape of the protrusions 275, 277, and 278 is not limited thereto, and may be variously modified according to the shape of the protrusion 300a of the sacrificial layer 300. In the case where the cross-sectional shape of the protrusion 300a of the sacrificial layer 300 has a semicircular shape, the cross-sectional shape of the protrusions 275, 277, and 278 may have a semicircular shape.

The planar shape of the protrusions 275, 277, and 278 may have a cross shape. The planar shape of the protrusions 275, 277, and 278 may be variously modified according to the planar shape of the protrusion 300a of the sacrificial layer 300.

Next, a second insulating layer 350 may be formed on the common electrode 270 by using an inorganic insulating material such as silicon oxide or silicon nitride. Since the protrusions 275, 277, and 278 are formed on the common electrode 270, protrusions are formed even on the second insulating layer 350.

Next, a roof layer 360 is formed by coating and patterning an organic material on the second insulating layer 350. In this case, the organic material positioned at the first valley V1 may be patterned so as to be removed. As a result, the roof layers 360 may be formed to be connected to each other along a plurality of pixel rows.

Next, the second insulating layer 350 and the common electrode 270 are patterned by using the roof layer 360 as a mask to remove the second insulating layer 350 and the common electrode 270 positioned at the first valley V1.

Next, a third insulating layer 370 may be formed on the roof layer 360 with an inorganic insulating material such as silicon nitride (SiNx) and silicon oxide (SiOx). The third insulating layer 370 positioned at the first valley V1 may be removed by patterning the third insulating layer 370. In this case, the third insulating layer 370 may be formed to cover an upper surface and a side of the roof layer 360.

The sacrificial layer 300 positioned at the first valley V1 is exposed to the outside by patterning the roof layer 360, the second insulating layer 350, the common electrode 270, and the third insulating layer 370.

Figure 17:
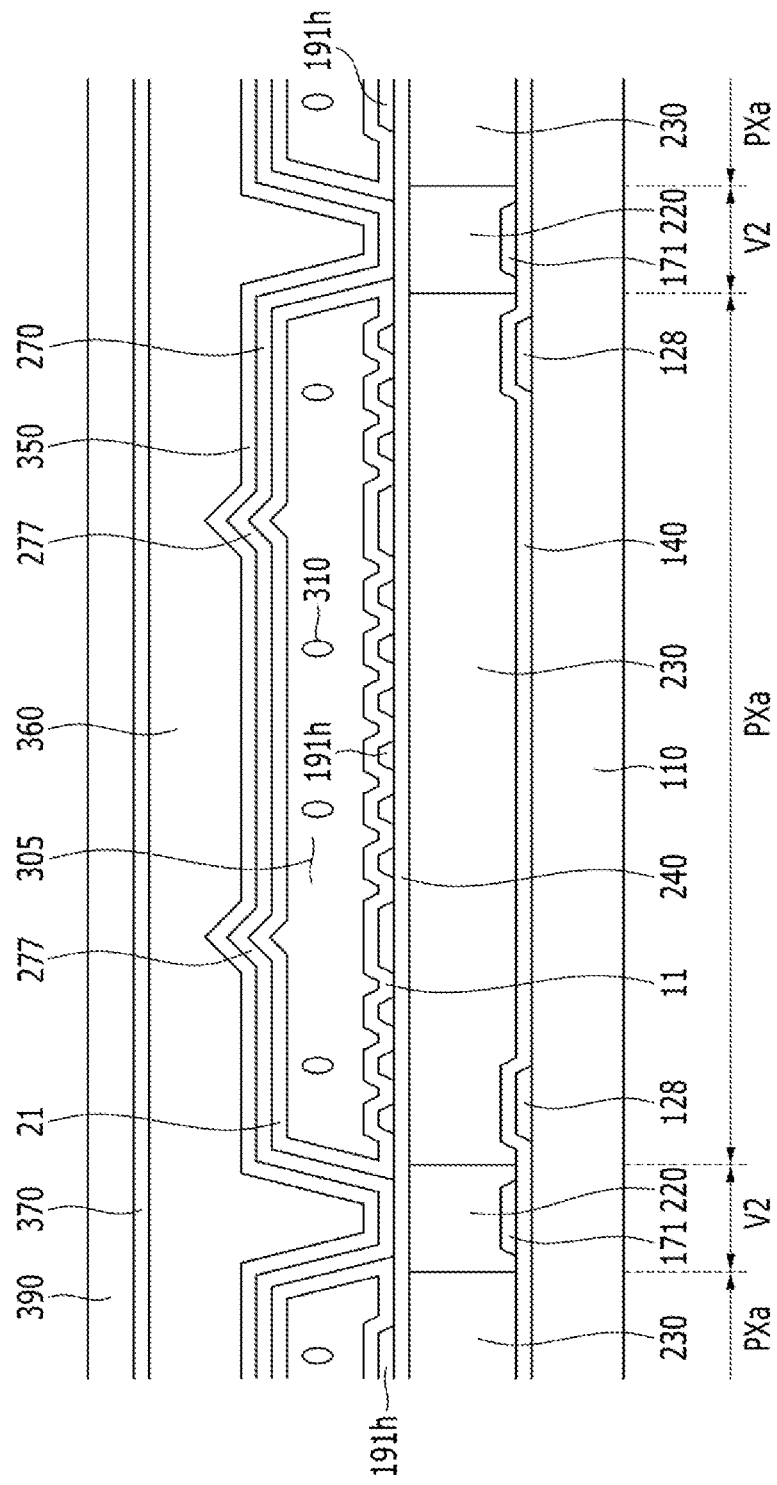

As illustrated in FIG. 17, the sacrificial layer 300 is fully removed by supplying a developer or a stripper solution on the substrate 110 where the sacrificial layer 300 is exposed, or fully removed by using an ashing process. In this case, the protrusion 300a of the sacrificial layer 300 is removed together.

When the sacrificial layer 300 is removed, the microcavity 305 is generated at a site where the sacrificial layer 300 is positioned.

The pixel electrode 191 and the common electrode 270 are spaced apart from each other with the microcavity 305 therebetween. The common electrode 270 and the roof layer 360 are formed to cover the upper surface and both sides of the microcavity 305.

The microcavity 305 is exposed to the outside through the portion where the roof layer 360 and the common electrode 270 are removed, and a portion where the microcavity 305 is exposed is called injection holes (307a and 307b of FIG. 4).

Next, when an aligning agent containing an alignment material drops on the substrate 110 by a spin coating method or an inkjet method, the aligning agent is injected into the microcavity 305 through the injection holes 307a and 307b. When the aligning agent is injected into the microcavity 305 and then a curing process is performed, a solution component is evaporated and the alignment material remains on the inner wall of the microcavity 305.

Accordingly, the first alignment layer 11 may be formed on the pixel electrode 191, and the second alignment layer 21 may be formed below the common electrode 270. The first alignment layer 11 and the second alignment layer 21 face each other with the microcavity 305 therebetween, and may be connected to each other on a side wall of the edge of the microcavity 305.

In this case, the first and second alignment layers 11 and 21 may be aligned in a vertical direction to the substrate 110, except for the side of the microcavity 305. Next, when the liquid crystal material including the liquid crystal molecules 310 is dropped on the substrate 110 by an inkjet method or a dispensing method, the liquid crystal material is injected into the microcavity 305 through the injection holes 307a and 307b by capillary force.

Next, an encapsulation layer 390 is formed by depositing a material which does not react with the liquid crystal molecules 310 on the third insulating layer 370. The encapsulation layer 390 is formed to cover the injection holes 307a and 307b to seal the microcavity 305 so that the liquid crystal molecules 310 formed in the microcavity 305 are not discharged outside.

Next, although not illustrated, polarizers may be further attached onto the upper and lower surfaces of the display device. The polarizers may be configured by a first polarizer and a second polarizer. The first polarizer may be attached onto the lower surface of the substrate 110, and the second polarizer may be attached onto the encapsulation layer 390.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

DESCRIPTION OF SYMBOLS

| | |
|---|---|
| 11: First alignment layer | 21: Second alignment layer |
| 91: Cutout | 110: Substrate |
| 121: Gate line | 123: Step-down gate line |
| 125: Storage electrode line | 171: Data line |
| 191: Pixel electrode | 191h: First subpixel electrode |
| 191l: Second subpixel electrode | 195: Horizontal stem |
| 197: Vertical stem | 198: Central pattern |
| 199: Minute branch | 220: Light blocking member |
| 230: Color filter | 270: Common electrode |
| 275: Horizontal protrusion | 277: Vertical protrusion |
| 278: Central protrusion | 300: Sacrificial layer |
| 300a: Protrusion of sacrificial layer | 305: Microcavity |
| 307a, 307b: Injection hole | 310: Liquid crystal molecule |
| 360: Roof layer | 390: Encapsulation layer |

What is claimed is:

1. A display device, comprising:
a substrate;
a switching element on the substrate;
a pixel electrode connected with the switching element;
a common electrode spaced apart from the pixel electrode on the pixel electrode with a plurality of microcavities comprising a microcavity therebetween, the common electrode comprising side portions covering sides of the microcavity;
a roof layer on the common electrode;
a liquid crystal layer filling the microcavity; and
an encapsulation layer on the roof layer to seal the microcavity,
wherein the common electrode includes an integral protrusion protruding upwards in a cross-sectional view from a portion contacting an upper surface of the microcavity, the portion contacting the upper surface of the microcavity extending between the side portions, a height of the microcavity positioned below the protrusion is larger than a height of a microcavity of a portion where the protrusion is not formed.

2. The display device of claim 1, wherein:
a cross-sectional shape of the protrusion has at least one of a triangle, a semicircle, a quadrangle, a trapezoid, and a semioval.

3. The display device of claim 2, wherein:
a cross-sectional shape of the protrusion has a shape where an upper side of the trapezoid is modified to be a curved line.

4. The display device of claim 1, wherein:
the protrusion has a cross shape in a plan view.

5. The display device of claim 4, wherein:
the protrusion includes
a horizontal protrusion,
a vertical protrusion, and
a central protrusion at a cross point of the horizontal protrusion and the vertical protrusion.

6. The display device of claim 4, wherein:
the pixel electrode includes
a horizontal stem,
a vertical stem,
a central pattern at a cross point of the horizontal stem and the vertical stem, and
a minute branch extending from the horizontal stem, the vertical stem, and the central pattern.

7. The display device of claim 6, wherein:
the horizontal stem, the vertical stem, and the central pattern overlap with the protrusion of the common electrode.

8. The display device of claim 4, wherein:
the pixel electrode has a planar shape, and
the pixel electrode includes a cutout which is adjacent to at least a part of the edge of the pixel electrode to be disposed along the edge.

9. The display device of claim 8, further comprising:
a gate line and a data line on the substrate; and
a storage electrode line on the substrate and configured to have a predetermined voltage applied,
wherein the switching element includes
a first switching element and a second switching element connected to the gate line and the data line, and
a third switching element connected to the gate line, the second switching element, and the storage electrode line,
the pixel electrode includes a first subpixel electrode and a second subpixel electrode,
the first subpixel electrode is connected to the first switching element, and
the second subpixel electrode is connected to the second switching element.

* * * * *